(12) United States Patent
Yamazaki et al.

(10) Patent No.: US 7,952,839 B2
(45) Date of Patent: May 31, 2011

(54) MAGNETORESISTIVE ELEMENT INCLUDING AN ANTIFERROMAGNETIC LAYER DISPOSED AWAY FROM A DETECTION SURFACE

(75) Inventors: Hiroshi Yamazaki, Tokyo (JP); Naoki Ohta, Tokyo (JP)

(73) Assignee: TDK Corporation, Tokyo (JP)

( * ) Notice: Subject to any disclaimer, the term of this patent is extended or adjusted under 35 U.S.C. 154(b) by 590 days.

(21) Appl. No.: 12/010,626

(22) Filed: Jan. 28, 2008

(65) Prior Publication Data

US 2009/0190271 A1 Jul. 30, 2009

(51) Int. Cl.
*G11B 5/33* (2006.01)
(52) U.S. Cl. .................... 360/324.1
(58) Field of Classification Search ........... 360/324.1, 360/327.32
See application file for complete search history.

(56) References Cited

U.S. PATENT DOCUMENTS

| | | |
|---|---|---|
| 6,519,124 B1 | 2/2003 | Redon et al. |
| 7,035,062 B1 | 4/2006 | Mao et al. |
| 7,177,122 B2 | 2/2007 | Hou et al. |
| 7,220,499 B2 | 5/2007 | Saito et al. |
| 2004/0207959 A1 | 10/2004 | Saito |
| 2004/0207962 A1* | 10/2004 | Saito et al. ............ 360/324.11 |
| 2005/0270703 A1 | 12/2005 | Hayakawa et al. |

FOREIGN PATENT DOCUMENTS

| | | |
|---|---|---|
| JP | A 2001-331913 | 11/2001 |
| JP | A 2004-335071 | 11/2004 |
| JP | A 2005-44489 | 2/2005 |
| JP | A 2005-346869 | 12/2005 |
| JP | A 2007-80904 | 3/2007 |

* cited by examiner

*Primary Examiner* — David D Davis
(74) *Attorney, Agent, or Firm* — Oliff & Berridge, PLC

(57) ABSTRACT

An MR element includes a first ferromagnetic layer, a second ferromagnetic layer, a spacer layer disposed between the first and second ferromagnetic layers; and an antiferromagnetic layer disposed on a side of the first ferromagnetic layer farther from the spacer layer. The antiferromagnetic layer is disposed away from a detection surface. The first ferromagnetic layer includes: a first portion having an end face located in the detection surface and a rear end opposite to the end face; and a second portion located away from the detection surface and connected to the rear end of the first portion. The first portion has a first surface touching the spacer layer, and a second surface that is opposite to the first surface and that does not touch the antiferromagnetic layer. The second portion has a third surface touching the antiferromagnetic layer, and a fourth surface opposite to the third surface. The distance between the first surface and the second surface is smaller than the distance between the third surface and an imaginary plane including the first surface.

13 Claims, 24 Drawing Sheets

MAGNETORESISTIVE ELEMENT INCLUDING AN ANTIFERROMAGNETIC LAYER DISPOSED AWAY FROM A DETECTION SURFACE

BACKGROUND OF THE INVENTION

1. Field of the Invention

The present invention relates to a magnetoresistive element, and to a thin-film magnetic head, a head assembly and a magnetic disk drive each including the magnetoresistive element.

2. Description of the Related Art

Performance improvements in thin-film magnetic heads have been sought as areal recording density of magnetic disk drives has increased. A widely used type of thin-film magnetic head is a composite thin-film magnetic head that has a structure in which a write head having an induction-type electromagnetic transducer for writing and a read head having a magnetoresistive element (that may be hereinafter referred to as MR element) for reading are stacked on a substrate.

MR elements include GMR (giant magnetoresistive) elements utilizing a giant magnetoresistive effect, and TMR (tunneling magnetoresistive) elements utilizing a tunneling magnetoresistive effect.

Read heads are required to have characteristics of high sensitivity and high output. As the read heads that satisfy such requirements, those incorporating spin-valve GMR elements or TMR elements have been mass-produced.

Spin-valve GMR elements and TMR elements each typically include a free layer, a pinned layer, a spacer layer disposed between the free layer and the pinned layer, and an antiferromagnetic layer disposed on a side of the pinned layer farther from the spacer layer. The free layer is a ferromagnetic layer whose magnetization changes its direction in response to a signal magnetic field. The pinned layer is a ferromagnetic layer having a magnetization in a fixed direction. The antiferromagnetic layer is a layer that fixes the direction of the magnetization of the pinned layer by means of exchange coupling with the pinned layer. The spacer layer is a nonmagnetic conductive layer in spin-valve GMR elements, or is a tunnel barrier layer in TMR elements.

Read heads incorporating GMR elements include those having a CIP (current-in-plane) structure in which a current used for detecting a signal magnetic field (hereinafter referred to as a sense current) is fed in the direction parallel to the planes of the layers constituting the GMR element, and those having a CPP (current-perpendicular-to-plane) structure in which the sense current is fed in a direction intersecting the planes of the layers constituting the GMR element, such as the direction perpendicular to the planes of the layers constituting the GMR element. Read heads incorporating the TMR elements mentioned above are also of the CPP structure.

Read heads each have a pair of shields sandwiching the MR element. The distance between the two shields taken in a medium facing surface that faces toward a recording medium is called a read gap length. Recently, with an increase in recording density, there have been increasing demands for a reduction in track width and a reduction in read gap length in read heads.

In a typical configuration of an MR element having the free layer, the pinned layer, the spacer layer and the antiferromagnetic layer, an end face of each of the free layer, the pinned layer, the spacer layer and the antiferromagnetic layer is exposed at the medium facing surface. In the MR element having such a configuration, it is difficult to reduce the read gap length because the antiferromagnetic layer is relatively great in thickness.

As a technique enabling a reduction in read gap length in an MR element having the free layer, the pinned layer, the spacer layer and the antiferromagnetic layer, there is known one in which the antiferromagnetic layer is disposed away from the medium facing surface, as disclosed in JP 2005-44489A, JP 2004-335071A, JP 2005-346869A, and JP 2007-80904A, for example. According to this technique, an end face of the antiferromagnetic layer is not exposed at the medium facing surface and it is therefore possible to reduce the read gap length by a length equivalent to the thickness of the antiferromagnetic layer, compared with the case where an end face of the antiferromagnetic layer is exposed at the medium facing surface.

However, the above technique cannot respond to a demand for a further reduction in read gap length.

OBJECT AND SUMMARY OF THE INVENTION

It is an object of the present invention to provide a magnetoresistive element to be disposed between a pair of shields, the magnetoresistive element being capable of reducing the distance between the pair of shields taken in a surface that receives a magnetic field to be detected, and to provide a thin-film magnetic head, a head assembly and a magnetic disk drive each including the magnetoresistive element.

A magnetoresistive element of the present invention is to be disposed between a pair of shields. The magnetoresistive element of the invention includes: a detection surface that receives a magnetic field to be detected; a first ferromagnetic layer; a second ferromagnetic layer whose magnetization changes its direction in response to an external magnetic field; a spacer layer made of a nonmagnetic material and disposed between the first and second ferromagnetic layers; and an antiferromagnetic layer disposed on a side of the first ferromagnetic layer farther from the spacer layer and exchange-coupled to the first ferromagnetic layer.

The first ferromagnetic layer, the second ferromagnetic layer and the spacer layer extend in a direction intersecting the detection surface. Each of the second ferromagnetic layer and the spacer layer has an end face located in the detection surface. The antiferromagnetic layer is disposed away from the detection surface. The first ferromagnetic layer includes: a first portion having an end face located in the detection surface and a rear end opposite to the end face; and a second portion located away from the detection surface and connected to the rear end of the first portion. The first portion has a first surface touching the spacer layer, and a second surface that is opposite to the first surface and that does not touch the antiferromagnetic layer. The second portion has a third surface touching the antiferromagnetic layer, and a fourth surface opposite to the third surface. The distance between the first surface and the second surface is smaller than the distance between the third surface and an imaginary plane including the first surface.

In the magnetoresistive element of the present invention, the first ferromagnetic layer may include: a first ferromagnetic material layer made of a ferromagnetic material and touching the antiferromagnetic layer; a second ferromagnetic material layer made of a ferromagnetic material and touching the spacer layer; and a nonmagnetic intermediate layer that is made of a nonmagnetic conductive material and inserted between the first and second ferromagnetic material layers and that antiferromagnetically couples the first and second ferromagnetic material layers to each other. In this case, the second ferromagnetic material layer may be present in the first portion and the second portion, while the first ferromagnetic material layer may be present only in the second portion out of the first and second portions. Furthermore, in this case, the nonmagnetic intermediate layer may be present only in the second portion out of the first and second portions, or may be present in the first portion and the second portion.

In the magnetoresistive element of the present invention, the antiferromagnetic layer may have a fifth surface touching the third surface of the second portion, and a sixth surface opposite to the fifth surface, and the magnetoresistive element may further include an insulating layer touching the sixth surface.

A thin-film magnetic head of the present invention includes: a medium facing surface that faces toward a recording medium; a first shield and a second shield each extending in a direction intersecting the medium facing surface; and a magnetoresistive element disposed between the first and second shields near the medium facing surface to detect a signal magnetic field sent from the recording medium.

In the thin-film magnetic head of the invention, the magnetoresistive element includes: a detection surface that is located in the medium facing surface and receives the signal magnetic field sent from the recording medium; a first ferromagnetic layer; a second ferromagnetic layer whose magnetization changes its direction in response to an external magnetic field; a spacer layer made of a nonmagnetic material and disposed between the first and second ferromagnetic layers; and an antiferromagnetic layer disposed on a side of the first ferromagnetic layer farther from the spacer layer and exchange-coupled to the first ferromagnetic layer. The first ferromagnetic layer is located closer to the first shield than is the second ferromagnetic layer.

The first ferromagnetic layer, the second ferromagnetic layer and the spacer layer extend in a direction intersecting the detection surface. Each of the second ferromagnetic layer and the spacer layer has an end face located in the detection surface. The antiferromagnetic layer is disposed away from the detection surface. The first ferromagnetic layer includes: a first portion having an end face located in the detection surface and a rear end opposite to the end face; and a second portion located away from the detection surface and connected to the rear end of the first portion. The first portion has a first surface touching the spacer layer, and a second surface that is opposite to the first surface and that does not touch the antiferromagnetic layer. The second portion has a third surface touching the antiferromagnetic layer, and a fourth surface opposite to the third surface. The distance between the first surface and the second surface is smaller than the distance between the third surface and an imaginary plane including the first surface.

In the thin-film magnetic head of the present invention, the first ferromagnetic layer may include: a first ferromagnetic material layer made of a ferromagnetic material and touching the antiferromagnetic layer; a second ferromagnetic material layer made of a ferromagnetic material and touching the spacer layer; and a nonmagnetic intermediate layer that is made of a nonmagnetic conductive material and inserted between the first and second ferromagnetic material layers and that antiferromagnetically couples the first and second ferromagnetic material layers to each other. In this case, the second ferromagnetic material layer may be present in the first portion and the second portion, while the first ferromagnetic material layer may be present only in the second portion out of the first and second portions. Furthermore, in this case, the nonmagnetic intermediate layer may be present only in the second portion out of the first and second portions, or may be present in the first portion and the second portion.

In the thin-film magnetic head of the present invention, the antiferromagnetic layer may have a front end face closer to the medium facing surface, and the first shield may include a portion located between the medium facing surface and the front end face of the antiferromagnetic layer.

In the thin-film magnetic head of the present invention, the magnetoresistive element may further include an insulating layer disposed between the antiferromagnetic layer and the first shield.

A head assembly of the present invention includes: a slider including the thin-film magnetic head of the invention and disposed to face toward the recording medium; and a supporter flexibly supporting the slider.

A magnetic disk drive of the present invention includes: a slider including the thin-film magnetic head of the invention and disposed to face toward the recording medium that is driven to rotate; and an alignment device supporting the slider and aligning the slider with respect to the recording medium.

According to the present invention, in the magnetoresistive element the antiferromagnetic layer, which is exchange-coupled to the first ferromagnetic layer, is disposed away from the detection surface. Furthermore, according to the present invention, the thickness of the portion of the first ferromagnetic layer exposed at the detection surface, or in other words, the distance between the first surface and the second surface, is smaller than the distance between the spacer layer and the antiferromagnetic layer taken in the direction in which the layers of the magnetoresistive element are stacked, or in other words, the distance between the third surface and the imaginary plane including the first surface. As a result, according to the present invention, it is possible to reduce the distance between the pair of shields taken in the surface that receives the magnetic field to be detected.

Other and further objects, features and advantages of the invention will appear more fully from the following description.

DETAILED DESCRIPTION OF THE PREFERRED EMBODIMENTS

First Embodiment

Figure 4:
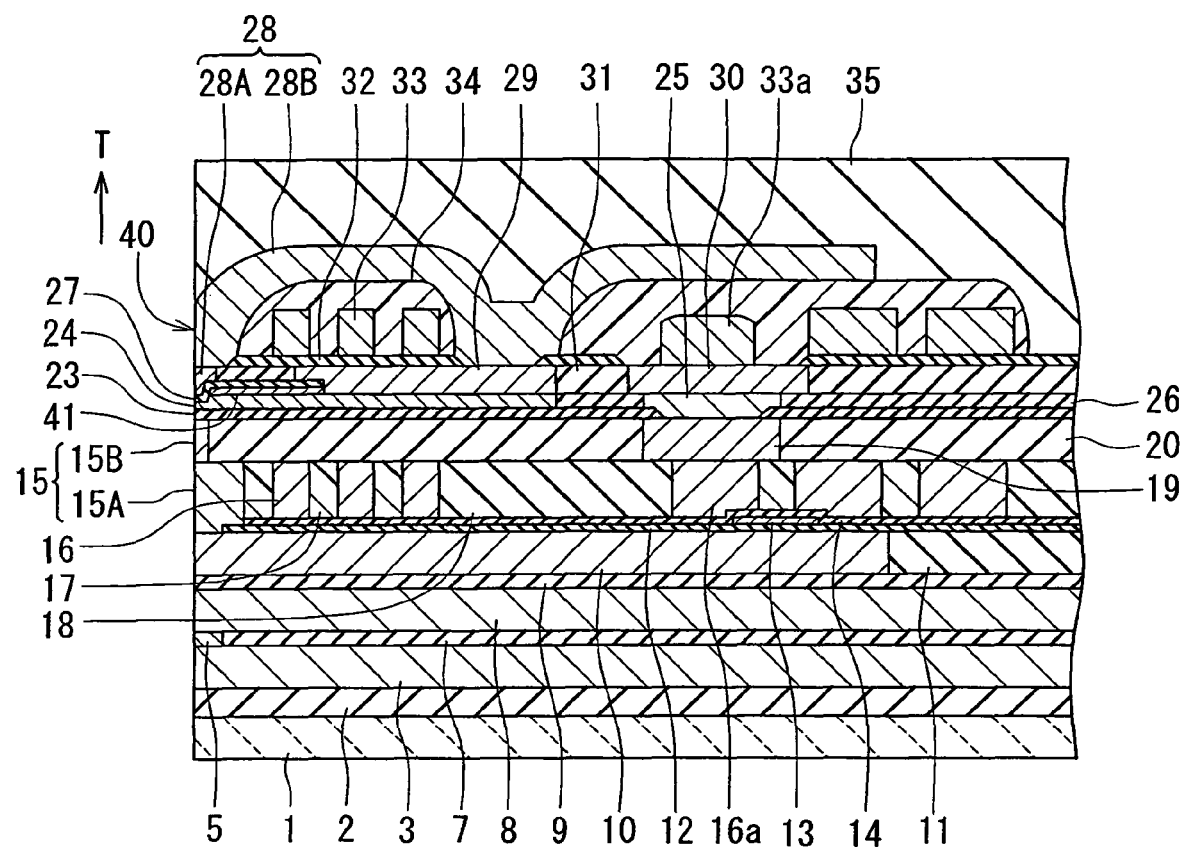
FIG. 4 is a cross-sectional view illustrating the configuration of a thin-film magnetic head of the first embodiment of the invention.
Figure 5:
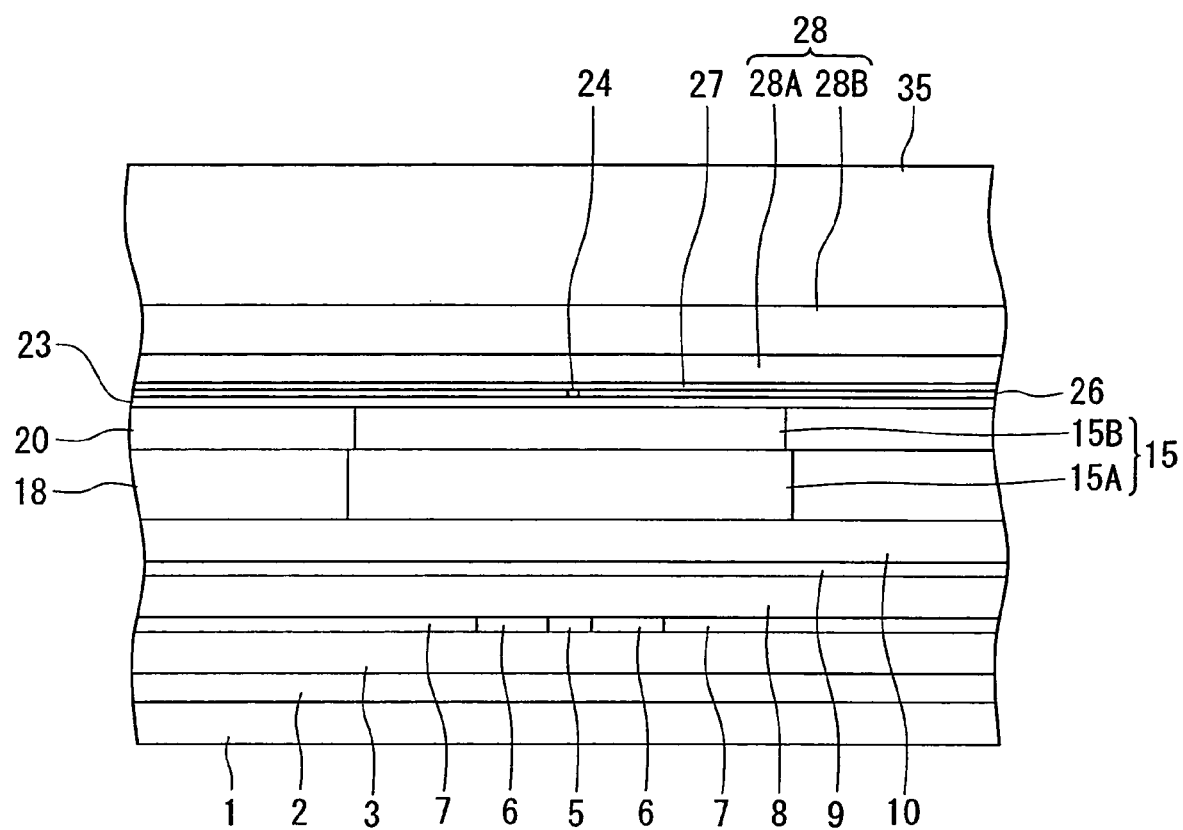
FIG. 5 is a front view illustrating the medium facing surface of the thin-film magnetic head of the first embodiment of the invention.

Embodiments of the present invention will now be described in detail with reference to the drawings. Reference is first made to FIG. 4 and FIG. 5 to describe the configuration of a thin-film magnetic head of a first embodiment of the invention. FIG. 4 is a cross-sectional view illustrating the configuration of the thin-film magnetic head. FIG. 5 is a front view illustrating the medium facing surface of the thin-film magnetic head. FIG. 4 illustrates a cross section perpendicular to the medium facing surface and the top surface of the substrate. The arrow marked with T in FIG. 4 shows the direction of travel of the recording medium.

As illustrated in FIG. 4, the thin-film magnetic head of the embodiment has a medium facing surface 40 that faces toward the recording medium. As illustrated in FIG. 4 and FIG. 5, the thin-film magnetic head includes: a substrate 1 made of a ceramic material such as aluminum oxide and titanium carbide ($Al_2O_3$—TiC); an insulating layer 2 made of an insulating material such as alumina ($Al_2O_3$) and disposed on the substrate 1; a first read shield 3 made of a magnetic material and disposed on the insulating layer 2; an MR element 5 disposed on the first read shield 3; two bias magnetic field applying layers 6 disposed adjacent to two sides of the MR element 5, respectively, with insulating films (not shown) respectively disposed therebetween; and an insulating layer 7 disposed around the MR element 5 and the bias magnetic field applying layers 6. The MR element 5 has an end located in the medium facing surface 40. The insulating layer 7 is made of an insulating material such as alumina. The thin-film magnetic head further includes: a second read shield 8 made of a magnetic material and disposed on the MR element 5, the bias magnetic field applying layers 6 and the insulating layer 7; and a separating layer 9 made of a nonmagnetic material such as alumina and disposed on the second read shield 8. The portion from the first read shield 3 to the second read shield 8 makes up a read head.

The MR element 5 is a TMR element or a GMR element of the CPP structure. A sense current for detecting a signal magnetic field is fed to the MR element 5 in a direction intersecting the planes of layers constituting the MR element 5, such as the direction perpendicular to the planes of the layers constituting the MR element 5.

The thin-film magnetic head further includes: a magnetic layer 10 made of a magnetic material and disposed on the separating layer 9; and an insulating layer 11 made of an insulating material such as alumina and disposed around the magnetic layer 10. The magnetic layer 10 has an end face located in the medium facing surface 40. The magnetic layer 10 and the insulating layer 11 have flattened top surfaces.

The thin-film magnetic head further includes: an insulating film 12 disposed on the magnetic layer 10 and the insulating layer 11; a heater 13 disposed on the insulating film 12; and an insulating film 14 disposed on the insulating film 12 and the heater 13 such that the heater 13 is sandwiched between the insulating films 12 and 14. The function and material of the heater 13 will be described later. The insulating films 12 and 14 are made of an insulating material such as alumina.

The thin-film magnetic head further includes a first write shield 15 disposed on the magnetic layer 10. The first write shield 15 includes: a first layer 15A disposed on the magnetic layer 10; and a second layer 15B disposed on the first layer 15A. The first layer 15A and the second layer 15B are made of a magnetic material. Each of the first layer 15A and the second layer 15B has an end face located in the medium facing surface 40. In the example illustrated in FIG. 4, the length of the second layer 15B taken in the direction perpendicular to the medium facing surface 40 is smaller than the length of the first layer 15A taken in the direction perpendicular to the medium facing surface 40. However, the length of the second layer 15B taken in the direction perpendicular to the medium facing surface 40 may be equal to or greater than the length of the first layer 15A taken in the direction perpendicular to the medium facing surface 40.

The thin-film magnetic head further includes: a coil 16 made of a conductive material and disposed on the insulating film 14; an insulating layer 17 that fills the space between the coil 16 and the first layer 15A and the space between respective adjacent turns of the coil 16; and an insulating layer 18 disposed around the first layer 15A, the coil 16 and the insulating layer 17. The coil 16 is planar spiral-shaped. The coil 16 includes a connecting portion 16a that is a portion near an inner end of the coil 16 and connected to another coil described later. The insulating layer 17 is made of photoresist, for example. The insulating layer 18 is made of alumina, for example. The first layer 15A, the coil 16, the insulating layer 17 and the insulating layer 18 have flattened top surfaces.

The thin-film magnetic head further includes: a connecting layer 19 made of a conductive material and disposed on the connecting portion 16a; and an insulating layer 20 made of an insulating material such as alumina and disposed around the second layer 15B and the connecting layer 19. The connecting layer 19 may be made of the same material as the second layer 15B. The second layer 15B, the connecting layer 19 and the insulating layer 20 have flattened top surfaces.

The thin-film magnetic head further includes a first gap layer 23 disposed on the second layer 15B, the connecting layer 19 and the insulating layer 20. The first gap layer 23 has an opening formed in a region corresponding to the top surface of the connecting layer 19. The first gap layer 23 is made of a nonmagnetic insulating material such as alumina.

The thin-film magnetic head further includes: a pole layer 24 made of a magnetic material and disposed on the first gap layer 23; a connecting layer 25 made of a conductive material and disposed on the connecting layer 19; and an insulating layer 26 made of an insulating material such as alumina and disposed around the pole layer 24 and the connecting layer 25. The pole layer 24 has an end face located in the medium facing surface 40. The connecting layer 25 is connected to the connecting layer 19 through the opening of the first gap layer 23. The connecting layer 25 may be made of the same material as the pole layer 24.

The thin-film magnetic head further includes a nonmagnetic layer 41 made of a nonmagnetic material and disposed on part of the top surface of the pole layer 24. The nonmagnetic layer 41 is made of an inorganic insulating material or a metal material, for example. Examples of the inorganic insulating material used for the nonmagnetic layer 41 include alumina and $SiO_2$. Examples of the metal material used for the nonmagnetic layer 41 include Ru and Ti.

The thin-film magnetic head further includes a second gap layer 27 disposed on part of the pole layer 24 and on the nonmagnetic layer 41. A portion of the top surface of the pole layer 24 apart from the medium facing surface 40 and the top surface of the connecting layer 25 are not covered with the nonmagnetic layer 41 and the second gap layer 27. The second gap layer 27 is made of a nonmagnetic material such as alumina.

The thin-film magnetic head further includes a second write shield 28 disposed on the second gap layer 27. The second write shield 28 includes: a first layer 28A disposed adjacent to the second gap layer 27; and a second layer 28B disposed on a side of the first layer 28A opposite to the second gap layer 27 and connected to the first layer 28A. The first layer 28A and the second layer 28B are made of a magnetic material. Each of the first layer 28A and the second layer 28B has an end face located in the medium facing surface 40.

The thin-film magnetic head further includes: a yoke layer 29 made of a magnetic material and disposed on a portion of the pole layer 24 away from the medium facing surface 40; a connecting layer 30 made of a conductive material and disposed on the connecting layer 25; and an insulating layer 31 made of an insulating material such as alumina and disposed around the first layer 28A, the yoke layer 29 and the connecting layer 30. The yoke layer 29 and the connecting layer 30 may be made of the same material as the first layer 28A. The first layer 28A, the yoke layer 29, the connecting layer 30 and the insulating layer 31 have flattened top surfaces.

The thin-film magnetic head further includes an insulating layer 32 made of an insulating material such as alumina and disposed on the yoke layer 29 and the insulating layer 31. The insulating layer 32 has an opening for exposing the top surface of the first layer 28A, an opening for exposing a portion of the top surface of the yoke layer 29 near an end thereof farther from the medium facing surface 40, and an opening for exposing the top surface of the connecting layer 30.

The thin-film magnetic head further includes a coil 33 made of a conductive material and disposed on the insulating layer 32. The coil 33 is planar spiral-shaped. The coil 33 includes a connecting portion 33a that is a portion near an inner end of the coil 33 and connected to the connecting portion 16a of the coil 16. The connecting portion 33a is connected to the connecting layer 30, and connected to the connecting portion 16a through the connecting layers 19, 25 and 30.

The thin-film magnetic head further includes an insulating layer 34 disposed to cover the coil 33. The insulating layer 34 is made of photoresist, for example. The second layer 28B of the second write shield 28 is disposed on the first layer 28A, the yoke layer 29 and the insulating layer 34, and connects the first layer 28A and the yoke layer 29 to each other.

The thin-film magnetic head further includes an overcoat layer 35 made of an insulating material such as alumina and disposed to cover the second layer 28B. The portion from the magnetic layer 10 to the second layer 28B makes up a write head.

As described so far, the thin-film magnetic head includes the medium facing surface 40 that faces toward the recording medium, the read head, and the write head. The read head and the write head are stacked on the substrate 1. The read head is disposed backward along the direction T of travel of the recording medium (that is, disposed closer to the air-inflow end of the slider), while the write head is disposed forward along the direction T of travel of the recording medium (that is, disposed closer to the air-outflow end of the slider). The thin-film magnetic head writes data on the recording medium through the use of the write head, and reads data stored on the recording medium through the use of the read head.

The read head includes the first read shield 3 and the second read shield 8, and the MR element 5 disposed between the first read shield 3 and the second read shield 8 near the medium facing surface 40 to detect a signal magnetic field sent from the recording medium. The MR element 5 is a TMR element or a GMR element of the CPP structure. The first read shield 3 and the second read shield 8 also function as a pair of electrodes for feeding a sense current to the MR element 5 in a direction intersecting the planes of layers constituting the MR element 5, such as the direction perpendicular to the planes of the layers constituting the MR element 5. In addition to the first read shield 3 and the second read shield 8, another pair of electrodes may be provided on top and bottom of the MR element 5. The MR element 5 has a resistance that changes in response to an external magnetic field, that is, a signal magnetic field sent from the recording medium. The resistance of the MR element 5 can be determined from the sense current. It is thus possible, using the read head, to read data stored on the recording medium.

The write head includes the magnetic layer 10, the first write shield 15, the coil 16, the first gap layer 23, the pole layer 24, the nonmagnetic layer 41, the second gap layer 27, the second write shield 28, the yoke layer 29, and the coil 33. The first write shield 15 is located closer to the substrate 1 than is the second write shield 28. The pole layer 24 is located closer to the substrate 1 than is the second write shield 28.

The coils 16 and 33 generate a magnetic field that corresponds to data to be written on the recording medium. The pole layer 24 has an end face located in the medium facing surface 40, allows a magnetic flux corresponding to the magnetic field generated by the coils 16 and 33 to pass, and generates a write magnetic field used for writing the data on the recording medium by means of the perpendicular magnetic recording system.

The first write shield 15 is made of a magnetic material, and has an end face located in the medium facing surface 40 at a position backward of the end face of the pole layer 24 along the direction T of travel of the recording medium. The first gap layer 23 is made of a nonmagnetic material, has an end face located in the medium facing surface 40, and is disposed between the first write shield 15 and the pole layer 24. In the embodiment, the first write shield 15 includes the first layer 15A disposed on the magnetic layer 10, and the second layer 15B disposed on the first layer 15A. Part of the coil 16 is located on a side of the first layer 15A so as to pass through the space between the magnetic layer 10 and the pole layer 24.

The magnetic layer 10 has a function of returning a magnetic flux that has been generated from the end face of the pole layer 24 and has magnetized the recording medium. FIG. 4 illustrates an example in which the magnetic layer 10 has an end face located in the medium facing surface 40. However, since the magnetic layer 10 is connected to the first write shield 15 having an end face located in the medium facing surface 40, the magnetic layer 10 may have an end face that is closer to the medium facing surface 40 and located at a distance from the medium facing surface 40.

In the medium facing surface 40, the end face of the first write shield 15 (the end face of the second layer 15B) is located backward of the end face of the pole layer 24 along the direction T of travel of the recording medium (that is, located closer to the air-inflow end of the slider) with a specific small distance provided therebetween by the first gap layer 23. The distance between the end face of the pole layer 24 and the end face of the first write shield 15 in the medium facing surface 40 is preferably within a range of 0.05 to 0.7 μm, or more preferably within a range of 0.1 to 0.3 μm.

The first write shield 15 takes in a magnetic flux that is generated from the end face of the pole layer 24 located in the medium facing surface 40 and that expands in directions except the direction perpendicular to the plane of the recording medium, and thereby prevents this flux from reaching the recording medium. It is thereby possible to improve the recording density.

The second write shield 28 is made of a magnetic material, and has an end face located in the medium facing surface 40 at a position forward of the end face of the pole layer 24 along the direction T of travel of the recording medium. The second gap layer 27 is made of a nonmagnetic material, has an end face located in the medium facing surface 40, and is disposed between the second write shield 28 and the pole layer 24. In the embodiment, the second write shield 28 includes: the first layer 28A disposed adjacent to the second gap layer 27; and the second layer 28B disposed on a side of the first layer 28A opposite to the second gap layer 27 and connected to the first layer 28A. Part of the coil 33 is disposed to pass through the space surrounded by the pole layer 24 and the second write shield 28. The second write shield 28 is connected to a portion of the yoke layer 29 away from the medium facing surface 40. The second write shield 28 is thus connected to a portion of the pole layer 24 away from the medium facing surface 40 through the yoke layer 29. The pole layer 24, the second write shield 28 and the yoke layer 29 form a magnetic path that allows a magnetic flux corresponding to the magnetic field generated by the coil 33 to pass therethrough.

In the medium facing surface 40, the end face of the second write shield 28 (the end face of the first layer 28A) is located forward of the end face of the pole layer 24 along the direction T of travel of the recording medium (that is, located closer to the air-outflow end of the slider) with a specific small distance provided therebetween by the second gap layer 27. The distance between the end face of the pole layer 24 and the end face of the second write shield 28 in the medium facing surface 40 is preferably equal to or smaller than 200 nm, or more preferably within a range of 25 to 50 nm, so that the second write shield 28 can fully exhibit its function as a shield.

The position of the end of a bit pattern to be written on the recording medium is determined by the position of an end of the pole layer 24 closer to the second gap layer 27 in the medium facing surface 40. The second write shield 28 takes in a magnetic flux that is generated from the end face of the pole layer 24 located in the medium facing surface 40 and that expands in directions except the direction perpendicular to the plane of the recording medium, and thereby prevents this flux from reaching the recording medium. It is thereby possible to improve the recording density. Furthermore, the second write shield 28 takes in a disturbance magnetic field applied from outside the thin-film magnetic head to the thin-film magnetic head. It is thereby possible to prevent erroneous writing on the recording medium caused by the disturbance magnetic field intensively taken into the pole layer 24. The second write shield 28 also has a function of returning a magnetic flux that has been generated from the end face of the pole layer 24 and has magnetized the recording medium.

FIG. 4 illustrates an example in which neither the magnetic layer 10 nor the first write shield 15 is connected to the pole layer 24. However, the magnetic layer 10 may be connected to a portion of the pole layer 24 away from the medium facing surface 40. The coil 16 is not an essential component of the write head and can be dispensed with. In the example illustrated in FIG. 4, the yoke layer 29 is disposed on the pole layer 24, or in other words, disposed forward of the pole layer 24 along the direction T of travel of the recording medium (that is, disposed closer to the air-outflow end of the slider). However, the yoke layer 29 may be disposed below the pole layer 24, or in other words, disposed backward of the pole layer 24 along the direction T of travel of the recording medium (that is, disposed closer to the air-inflow end of the slider).

The heater 13 is provided for heating the components of the write head including the pole layer 24 so as to control the distance between the recording medium and the end face of the pole layer 24 located in the medium facing surface 40. Two leads that are not shown are connected to the heater 13. For example, the heater 13 is formed of a NiCr film or a layered film made up of a Ta film, a NiCu film and a Ta film. The heater 13 is energized through the two leads and thereby produces heat, and heats the components of the write head. As a result, the components of the write head expand and the end face of the pole layer 24 located in the medium facing surface 40 thereby gets closer to the recording medium.

While FIG. 4 and FIG. 5 illustrate a write head for a perpendicular magnetic recording system, the write head of the present embodiment may be one for a longitudinal magnetic recording system.

A method of manufacturing the thin-film magnetic head of the embodiment will now be outlined. In the method of manufacturing the thin-film magnetic head of the embodiment, first, components of a plurality of thin-film magnetic heads are formed on a single substrate (wafer) to thereby fabricate a substructure in which pre-sider portions each of which is to become a slider later are aligned in a plurality of rows. Next, the substructure is cut to form a slider aggregate including a plurality of pre-slider portions aligned in a row. Next, a surface formed in the slider aggregate by cutting the substructure is lapped to thereby form the medium facing surfaces 40 of the pre-slider portions included in the slider aggregate. Next, flying rails are formed in the medium facing surfaces 40. Next, the slider aggregate is cut so as to separate the plurality of pre-sider portions from one another, whereby a plurality of sliders respectively including the thin-film magnetic heads are formed.

Figure 1:
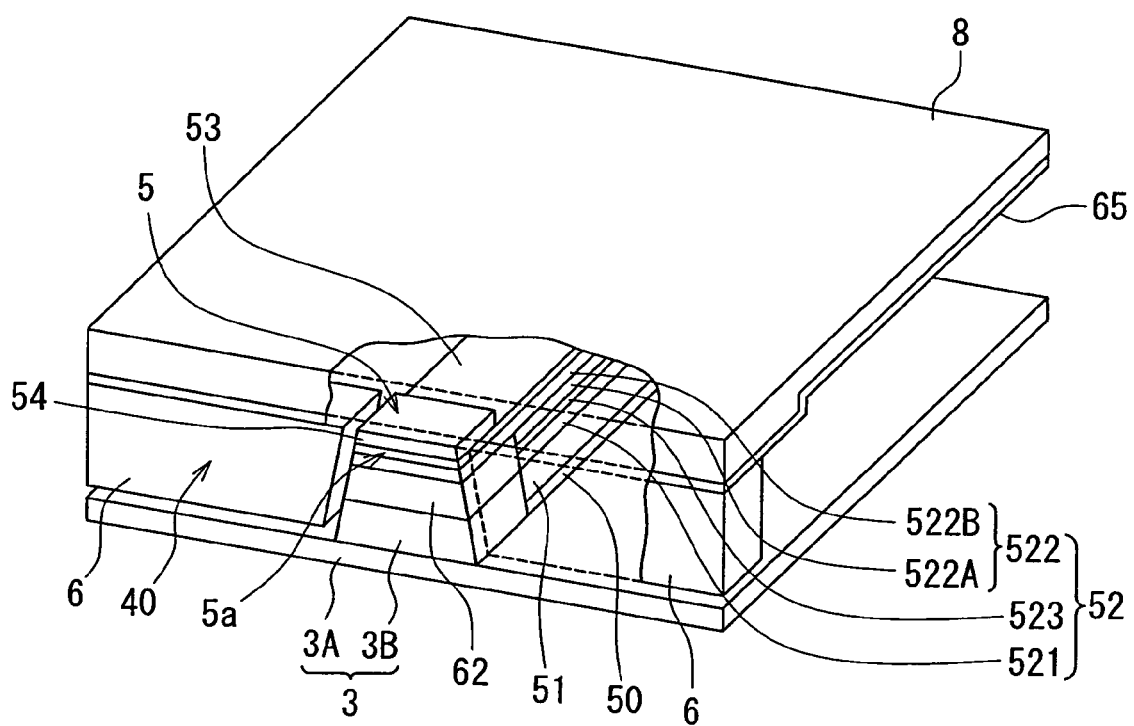
FIG. 1 is a perspective view of a read head including a magnetoresistive element of a first embodiment of the invention.
Figure 2:
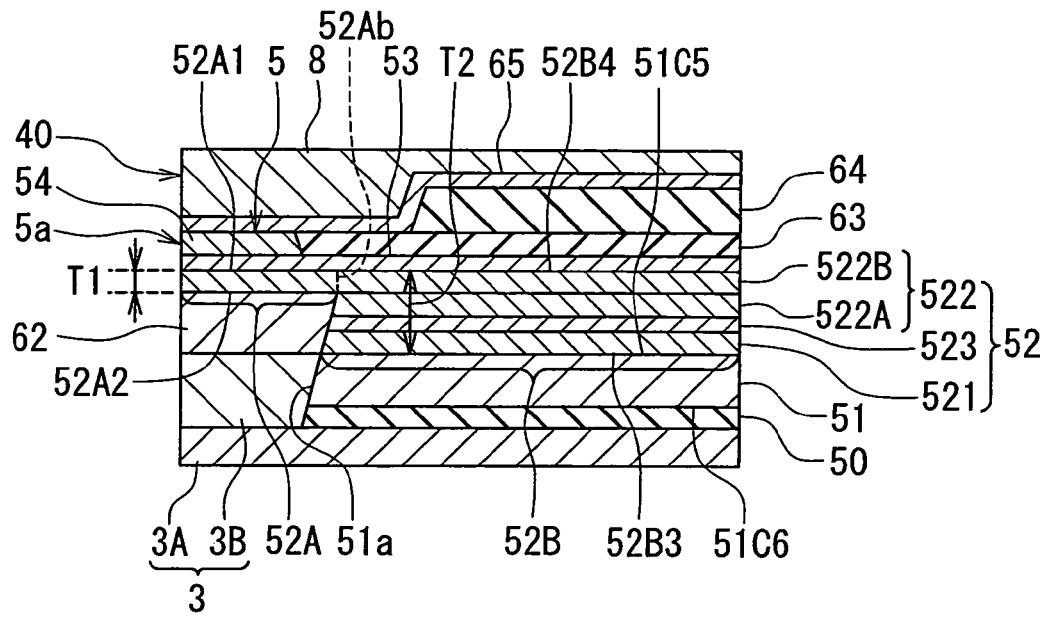
FIG. 2 is a cross-sectional view of the read head of FIG. 1.
Figure 3:
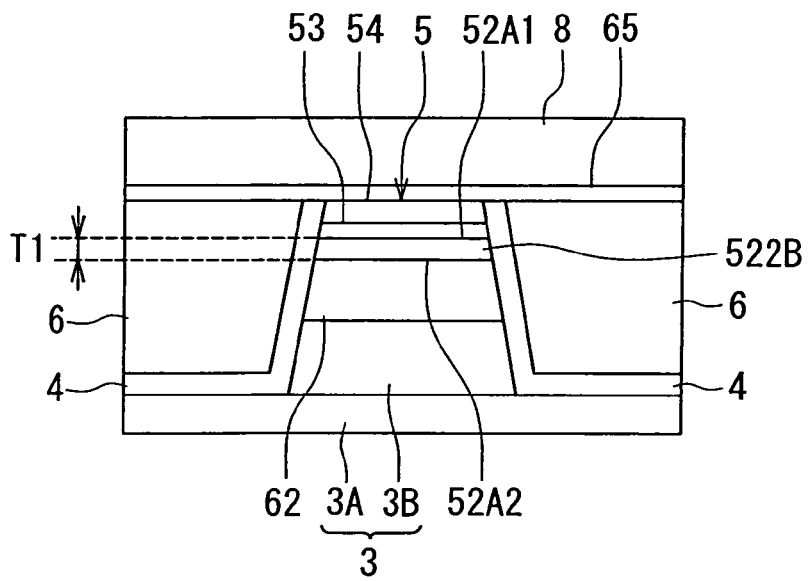
FIG. 3 is a front view of the read head of FIG. 1.

Reference is now made to FIG. 1 to FIG. 3 to describe the configurations of the MR element 5 and the read head of the embodiment in detail. FIG. 1 is a perspective view of the read head. FIG. 2 is a cross-sectional view of the read head. FIG. 3 is a front view of the read head.

The read head includes: the first read shield 3 and the second read shield 8 disposed at a predetermined distance from each other; the MR element 5 disposed between the read shields 3 and 8; an insulating film 4; the two bias magnetic field applying layers 6 that are respectively disposed adjacent to the two side surfaces of the MR element 5 with the insulating film 4 located therebetween, and that apply a bias magnetic field to the MR element 5; and the insulating layer 7 (see FIG. 4) disposed around the MR element 5 and the bias magnetic field applying layers 6. The bias magnetic field applying layers 6 generate a bias magnetic field in the direction of track width. The read shields 3 and 8 extend in a direction intersecting the medium facing surface 40. The insulating film 4 is disposed between each side surface of the MR element 5 and the bias magnetic field applying layers 6, and between the first read shield 3 and the bias magnetic field applying layers 6. Each of the shields 3 and 8 and the bias magnetic field applying layers 6 has an end face located in the medium facing surface 40. The first read shield 3 corresponds to the first shield of the present invention, and the second read shield 8 corresponds to the second shield of the present invention.

The read shields 3 and 8 are each made of a soft magnetic material such as NiFe, CoFe, CoFeB, CoFeNi, or FeN. The bias magnetic field applying layers 6 are each composed of a hard magnetic layer or a stack of a ferromagnetic layer and an antiferromagnetic layer, for example. Specifically, the bias magnetic field applying layers 6 are made of CoPt or CoCrPt, for example. The insulating film 4 and the insulating layer 7 are each made of alumina, for example.

The MR element 5 includes: a detection surface 5a that is located in the medium facing surface 40 and receives a signal magnetic field sent from the recording medium, which is a magnetic field to be detected; a first ferromagnetic layer 52; a second ferromagnetic layer 54 whose magnetization changes its direction in response to an external magnetic field; a spacer layer 53 made of nonmagnetic material and disposed between the first ferromagnetic layer 52 and the second ferromagnetic layer 54; an antiferromagnetic layer 51 disposed on a side of the first ferromagnetic layer 52 farther from the spacer layer 53 and exchange-coupled to the first ferromagnetic layer 52; and an insulating layer 50 disposed between the antiferromagnetic layer 51 and the first read shield 3.

The antiferromagnetic layer 51 is made of an antiferromagnetic material containing Mn and at least one element $M_{II}$ selected from the group consisting of Pt, Ru, Rh, Pd, Ni, Cu, Ir, Cr and Fe, for example. The Mn content of the material is preferably equal to or higher than 35 atomic percent and lower than or equal to 95 atomic percent, while the content of the other element $M_{II}$ of the material is preferably equal to or higher than 5 atomic percent and lower than or equal to 65 atomic percent. There are two types of the antiferromagnetic material, one is a non-heat-induced antiferromagnetic material that exhibits antiferromagnetism without any heat treatment and induces an exchange coupling magnetic field between a ferromagnetic material and itself, and the other is a heat-induced antiferromagnetic material that exhibits antiferromagnetism by undergoing heat treatment. The antiferromagnetic layer 51 can be made of either of these types.

Examples of the non-heat-induced antiferromagnetic material include a Mn alloy that has a γ phase, such as RuRhMn, FeMn, or IrMn. Examples of the heat-induced antiferromagnetic material include a Mn alloy that has a regular crystal structure, such as PtMn, NiMn, or PtRhMn.

The configuration of the first ferromagnetic layer 52 will be described in detail later. When the MR element 5 is a TMR element, the spacer layer 53 is a tunnel barrier layer. In this case, the spacer layer 53 is formed of an insulating material such as alumina, $SiO_2$ or MgO. When the MR element 5 is a GMR element of the CPP structure, the spacer layer 53 is a nonmagnetic conductive layer. In this case, the spacer layer 53 is formed of, for example, a nonmagnetic conductive material such as Ru, Rh, Ir, Re, Cr, Zr or Cu, or an oxide semiconductor material such as ZnO, $In_2O_3$ or $SnO_2$. The second ferromagnetic layer 54 is made of a ferromagnetic material such as CoFe or NiFe.

In the present embodiment, the first ferromagnetic layer 52 is located closer to the first read shield 3 than is the second ferromagnetic layer 54. The first ferromagnetic layer 52, the second ferromagnetic layer 54 and the spacer layer 53 extend in a direction intersecting the detection surface 5a.

Each of the second ferromagnetic layer 54 and the spacer layer 53 has an end face located in the detection surface 5a. The plane geometry of the second ferromagnetic layer 54 is rectangular. The spacer layer 53 extends to a position farther from the detection surface 5a, compared with the second ferromagnetic layer 54. The antiferromagnetic layer 51 is disposed away from the detection surface 5a.

The first ferromagnetic layer 52 includes: a first portion 52A having an end face located in the detection surface 5a and a rear end 52Ab opposite to the end face; and a second portion 52B located away from the detection surface 5a and connected to the rear end 52Ab of the first portion 52A. The first portion 52A has a first surface (top surface) 52A1 touching the spacer layer 53, and a second surface (bottom surface) 52A2 that is opposite to the first surface and that does not touch the antiferromagnetic layer 51. The second portion 52B has a third surface (bottom surface) 52B3 touching the antiferromagnetic layer 51, and a fourth surface (top surface) 52B4 opposite to the third surface. The distance T1 between the first surface 52A1 and the second surface 52A2 is smaller than the distance T2 between the third surface 52B3 and an imaginary plane including the first surface 52A1. In the embodiment, since there is no difference in height between the first surface 52A1 and the fourth surface 52B4, the distance T2 is equal to the distance between the third surface 52B3 and the fourth surface 52B4.

The second portion 52B touches the antiferromagnetic layer 51 and is exchange-coupled to the antiferromagnetic layer 51. As a result, the direction of the magnetization of the second portion 52B is fixed to the direction perpendicular to the detection surface 5a. In contrast, the first portion 52A does not touch the antiferromagnetic layer 51. Consequently, the direction of the magnetization of the first portion 52A is not fixed by the antiferromagnetic layer 51, and when no external magnetic field is present, the magnetization of the first portion 52A is in a direction perpendicular or nearly perpendicular to the detection surface 5a due to the effect of the magnetization of the second portion 52B.

The first ferromagnetic layer 52 includes: a first ferromagnetic material layer 521 touching the antiferromagnetic layer 51; a second ferromagnetic material layer 522 touching the spacer layer 53; and a nonmagnetic intermediate layer 523 that is made of a nonmagnetic conductive material and inserted between the first ferromagnetic material layer 521 and the second ferromagnetic material layer 522 and that antiferromagnetically couples the first ferromagnetic material layer 521 and the second ferromagnetic material layer 522 to each other via the RKKY interaction. The first ferromagnetic material layer 521 and the second ferromagnetic material layer 522 are each made of a ferromagnetic material such as CoFe or NiFe. The nonmagnetic intermediate layer 523 is made of Ru, Rh, Ir, Re, Cr, Zr or Cu, for example.

The second ferromagnetic material layer 522 includes a first layer 522A touching the nonmagnetic intermediate layer 523, and a second layer 522B located between the first layer 522A and the spacer layer 53. The second ferromagnetic material layer 522 is present in the first portion 52A and the second portion 52B. To be more specific, while the first layer 522A of the second ferromagnetic material layer 522 is present only in the second portion 52B out of the first and second portions 52A and 52B, the second layer 522B of the second ferromagnetic material layer 522 is present in the first portion 52A and the second portion 52B. The first ferromagnetic material layer 521 and the nonmagnetic intermediate layer 523 are present only in the second portion 52B out of the first and second portions 52A and 52B.

The antiferromagnetic layer 51 has a front end face 51a closer to the medium facing surface 40. The first read shield 3 includes a portion located between the medium facing surface 40 and the front end face 51a of the antiferromagnetic layer 51. Specifically, the first read shield 3 has a first layer 3A, and a second layer 3B located on the first layer 3A. The second layer 3B is located between the medium facing surface 40 and the front end face 51a of the antiferromagnetic layer 51.

The antiferromagnetic layer 51 has a fifth surface (top surface) 51C5 touching the third surface 52B3 of the second portion 52B, and a sixth surface (bottom surface) 51C6 opposite to the fifth surface. The insulating layer 50 touches the sixth surface 51C6 and is disposed between the antiferromagnetic layer 51 and the first layer 3A of the first read shield 3. The insulating layer 50 is made of alumina, for example.

The read head further includes a nonmagnetic conductive layer 62 disposed between the second surface (bottom surface) 52A2 of the first portion 52A and the top surface of the second layer 3B. The top surfaces of the nonmagnetic conductive layer 62 and the first layer 522A of the second ferromagnetic material layer 522 are flattened. The nonmagnetic conductive layer 62 is made of Ta, for example.

The read head further includes an insulating layer 63 disposed on the spacer layer 53 in a region on a side of the second ferromagnetic layer 54 farther from the detection surface 5a, and an insulating layer 64 disposed on the insulating layer 63. An end face of the insulating layer 63 closer to the detection surface 5a touches an end face of the second ferromagnetic layer 54 farther from the detection surface 5a. The insulating layer 64 is disposed away from the medium facing surface 40. An end face of the insulating layer 64 closer to the medium facing surface 40 is located farther from the medium facing surface 40 than is the end face of the second ferromagnetic layer 54 farther from the detection surface 5a. The insulating layer 63 is made of alumina, for example. The insulating layer 64 is made of $SiO_2$, for example.

The read head further includes a nonmagnetic conductive layer 65 disposed between the second read shield 8 and a combination of the MR element 5, the bias magnetic field applying layers 6 and the insulating layers 63 and 64. The nonmagnetic conductive layer 65 is made of Ta, for example.

In the read head, the sense current flows mainly through the portion sandwiched between the second layer 3B of the first read shield 3 and the second read shield 8, that is, through the nonmagnetic conductive layer 62, the first portion 52A of the first ferromagnetic layer 52, the spacer layer 53 and the second ferromagnetic layer 54. In the present embodiment, the insulating layer 50 is provided between the antiferromagnetic layer 51 and the first read shield 3. Consequently, there is hardly any sense current passing through the antiferromagnetic layer 51.

Reference is now made to FIG. 6A to FIG. 17A, FIG. 6B to FIG. 17B and FIG. 6C to FIG. 17C to describe a method of fabricating the read head, including the MR element 5, of the present embodiment. FIG. 6A to FIG. 17A each illustrate a cross section of a stack of layers formed in the course of fabricating the read head, the cross section being perpendicular to the medium facing surface and the top surface of the substrate. FIG. 6B to FIG. 17B each illustrate a cross section of the stack of layers taken at a position at which the medium facing surface is to be formed. FIG. 6C to FIG. 17C are top views of the stack of layers. The substrate 1 and the insulating layer 2 are omitted in FIG. 6A to FIG. 17A and FIG. 6B to FIG. 17B. In FIG. 6C to FIG. 17C the dotted line marked with "ABS" indicates the position at which the medium facing surface 40 is to be formed.

Figure 6A:
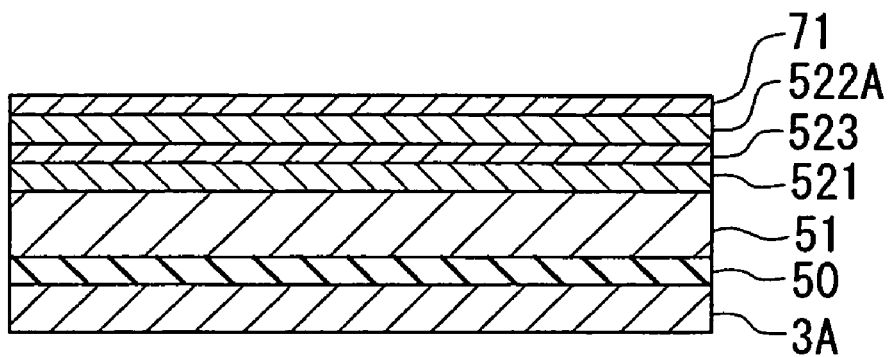
FIG. 6A to FIG. 6C are explanatory views illustrating a step of a method of fabricating the read head including the magnetoresistive element of the first embodiment of the invention.
Figure 6B:
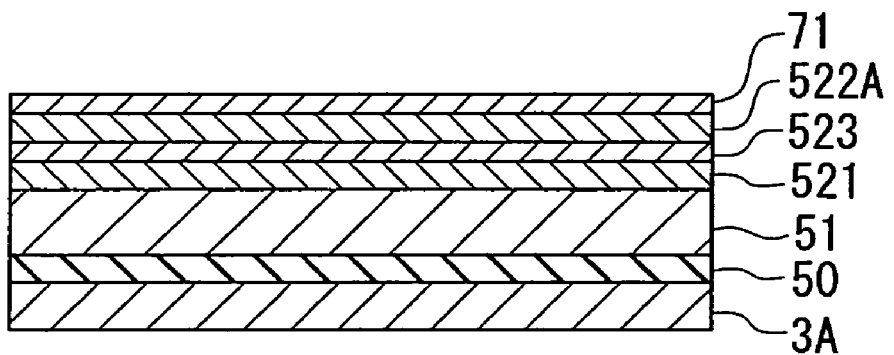
Figure 6C:
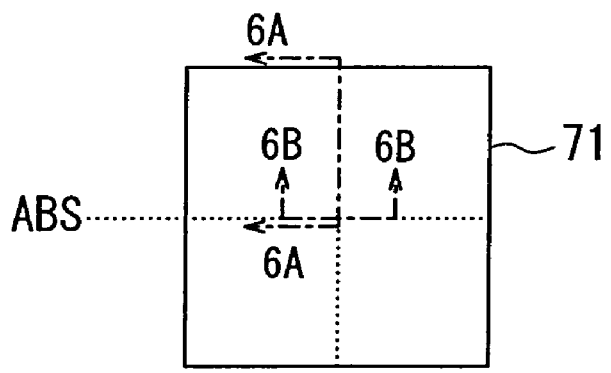

FIG. 6A to FIG. 6C illustrate a step of the method of fabricating the read head. FIG. 6A shows a cross section taken along line 6A-6A of FIG. 6C. FIG. 6B shows a cross section taken along line 6B-6B of FIG. 6C. In this step, first, the first layer 3A of the first read shield 3 is formed on the insulating layer 2 by frame plating, for example. Next, the insulating layer 50, the antiferromagnetic layer 51, the first ferromagnetic material layer 521, the nonmagnetic intermediate layer 523, the first layer 522A of the second ferromagnetic material layer 522, and a nonmagnetic conductive layer 71 are formed in this order on the first layer 3A by sputtering, for example. The nonmagnetic conductive layer 71 is formed of Ta, for example.

Figure 7A:
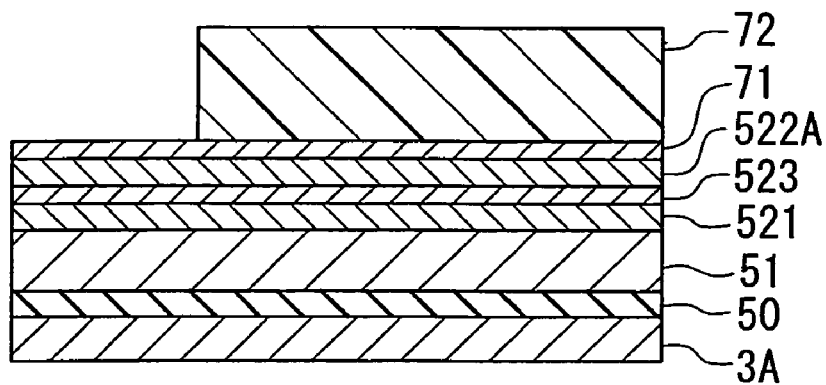
FIG. 7A to FIG. 7C are explanatory views illustrating a step that follows the step of FIG. 6A to FIG. 6C.
Figure 7B:
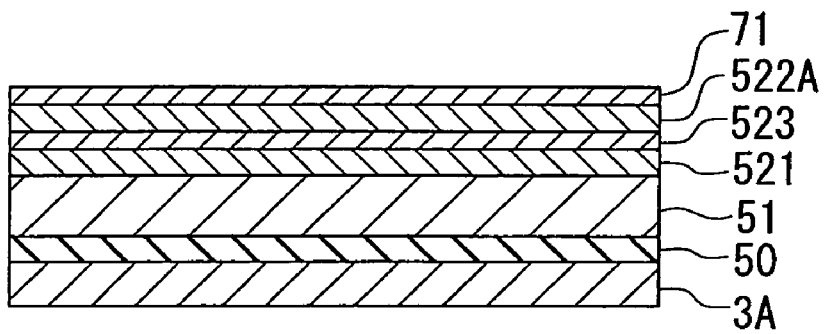
Figure 7C:
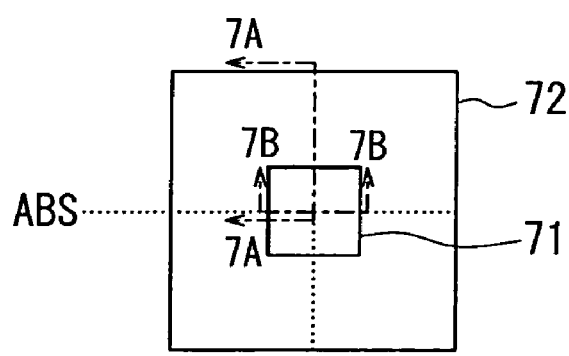

FIG. 7A to FIG. 7C illustrate the next step. FIG. 7A shows a cross section taken along line 7A-7A of FIG. 7C. FIG. 7B shows a cross section taken along line 7B-7B of FIG. 7C. In this step, a mask 72 is formed on the stack of layers shown in FIG. 6A to FIG. 6C. The mask 72 has an opening formed in a region in which the second layer 3B of the first read shield 3 and the nonmagnetic conductive layer 62 are to be disposed. The mask 72 is formed by patterning a photoresist layer through photolithography, for example.

Figure 8A:
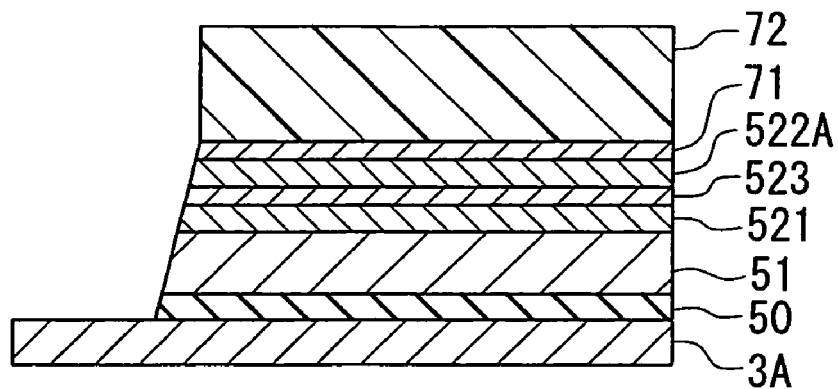
FIG. 8A to FIG. 8C are explanatory views illustrating a step that follows the step of FIG. 7A to FIG. 7C.
Figure 8B:
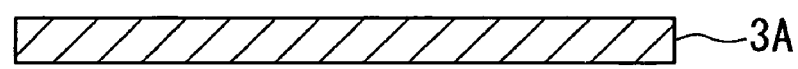
Figure 8C:
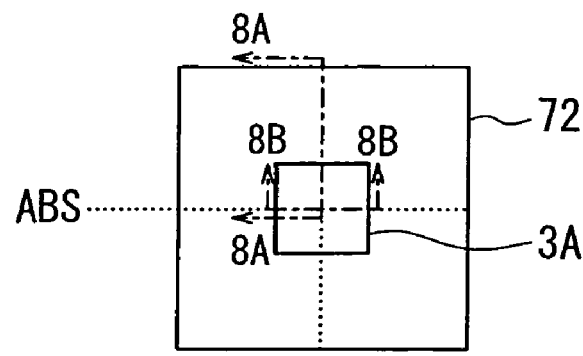

FIG. 8A to FIG. 8C illustrate the next step. FIG. 8A shows a cross section taken along line 8A-8A of FIG. 8C. FIG. 8B shows a cross section taken along line 8B-8B of FIG. 8C. In this step, a portion of a layered film made up of layers from the insulating layer 50 to the nonmagnetic conductive layer 71, the portion corresponding to the opening of the mask 72, is selectively etched by dry etching. As a result, a groove is formed in the above-mentioned layered film in the region in which the second layer 3B and the nonmagnetic conductive layer 62 are to be disposed.

Figure 9A:
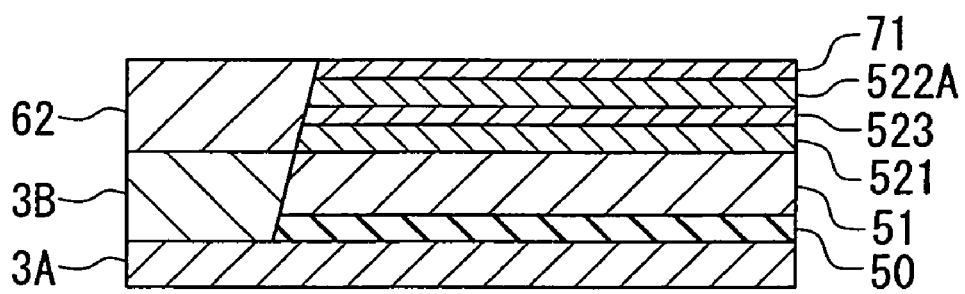
FIG. 9A to FIG. 9C are explanatory views illustrating a step that follows the step of FIG. 8A to FIG. 8C.
Figure 9B:
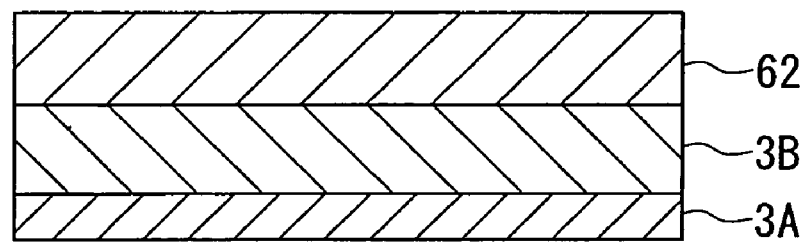
Figure 9C:
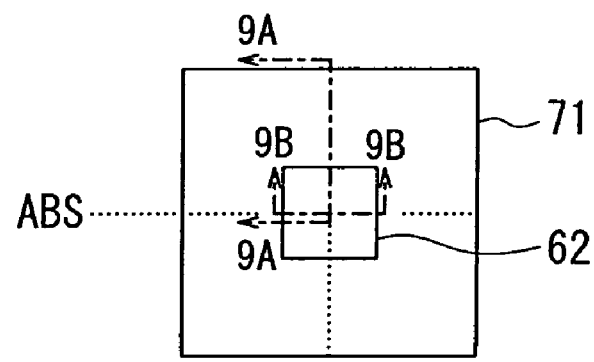

FIG. 9A to FIG. 9C illustrate the next step. FIG. 9A shows a cross section taken along line 9A-9A of FIG. 9C. FIG. 9B shows a cross section taken along line 9B-9B of FIG. 9C. In this step, first, with the mask 72 left unremoved, the second layer 3B and the nonmagnetic conductive layer 62 are formed in this order by sputtering, for example, so that the above-mentioned groove is filled with these layers. Next, the mask 72 is lifted off.

Figure 10A:
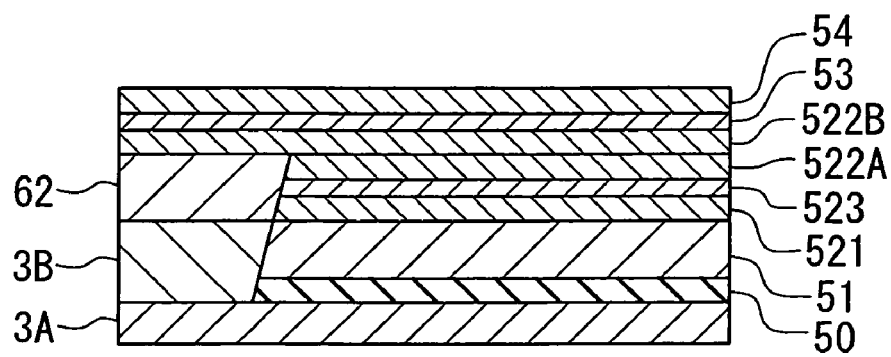
FIG. 10A to FIG. 10C are explanatory views illustrating a step that follows the step of FIG. 9A to FIG. 9C.
Figure 10B:
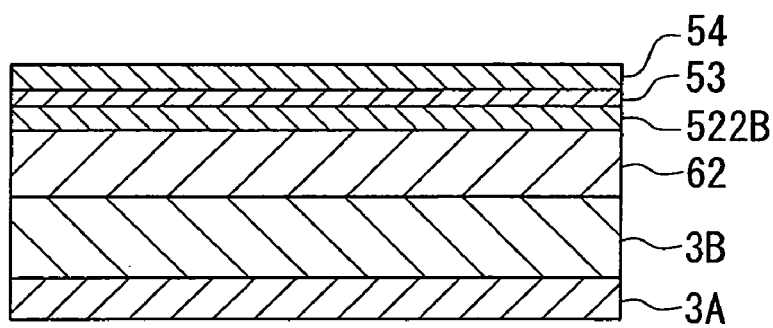
Figure 10C:
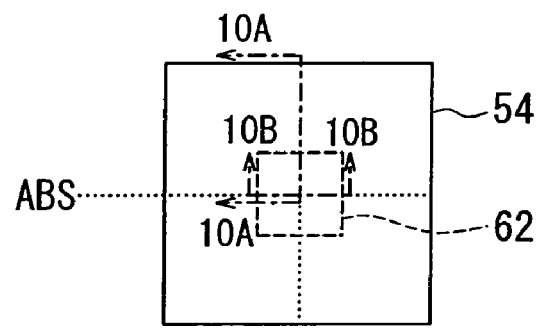

FIG. 10A to FIG. 10C illustrate the next step. FIG. 10A shows a cross section taken along line 10A-10A of FIG. 10C. FIG. 10B shows a cross section taken along line 10B-10B of FIG. 10C. In this step, first, the top surface of the stack of layers shown in FIG. 9A to FIG. 9C is polished by chemical mechanical polishing (hereinafter referred to as CMP), for example, until the first layer 522A is exposed. Next, the second layer 522B, the spacer layer 53 and the second ferromagnetic layer 54 are formed in this order by sputtering, for example, on the stack of layers having undergone the polishing.

Figure 11A:
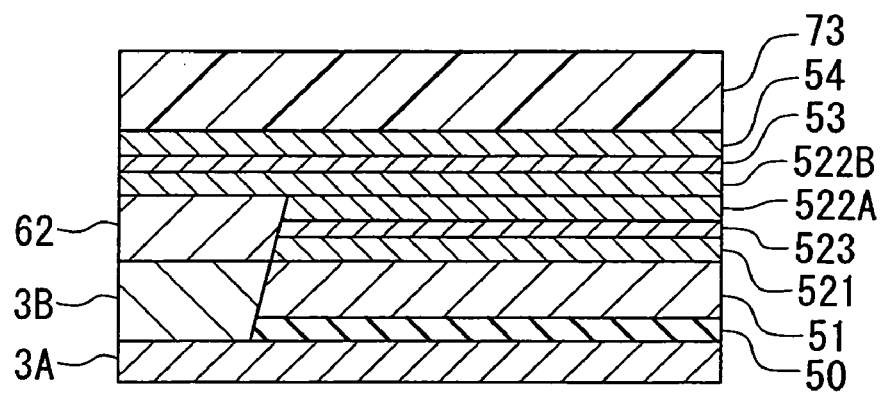
FIG. 11A to FIG. 11C are explanatory views illustrating a step that follows the step of FIG. 10A to FIG. 10C.
Figure 11B:
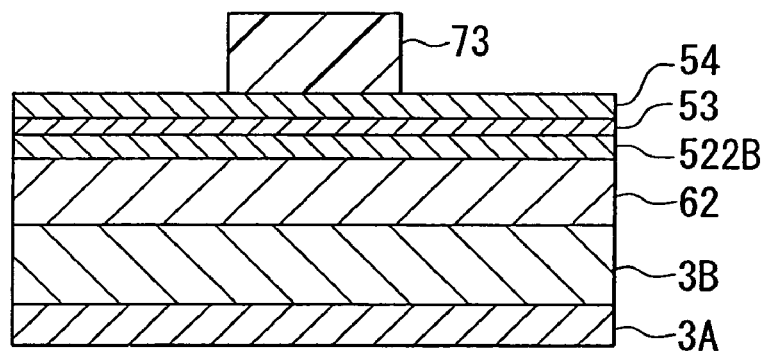
Figure 11C:
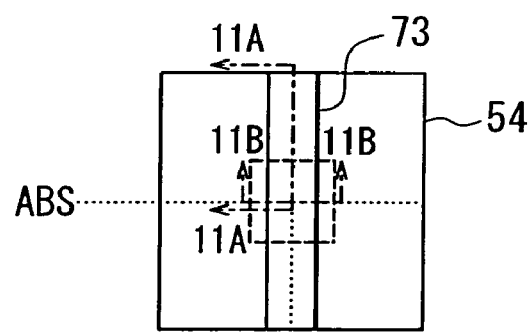

FIG. 11A to FIG. 11C illustrate the next step. FIG. 11A shows a cross section taken along line 11A-11A of FIG. 11C. FIG. 11B shows a cross section taken along line 11B-11B of FIG. 11C. In this step, first, a mask 73 for determining the width of the MR element 5 is formed on the stack of layers shown in FIG. 10A to FIG. 10C. The mask 73 is formed by patterning a photoresist layer through photolithography, for example.

Figure 12A:
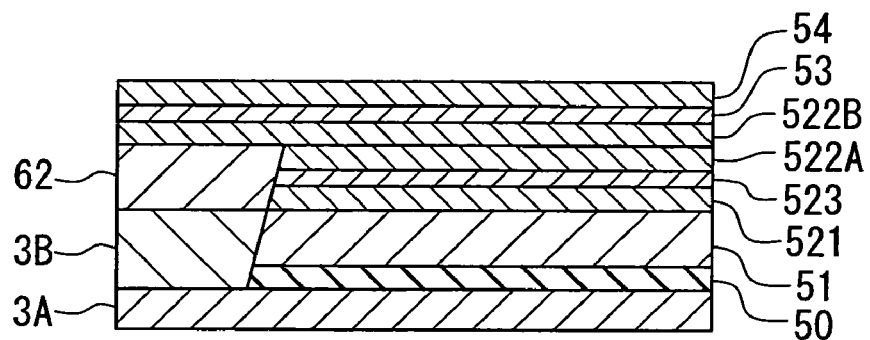
FIG. 12A to FIG. 12C are explanatory views illustrating a step that follows the step of FIG. 11A to FIG. 11C.
Figure 12B:
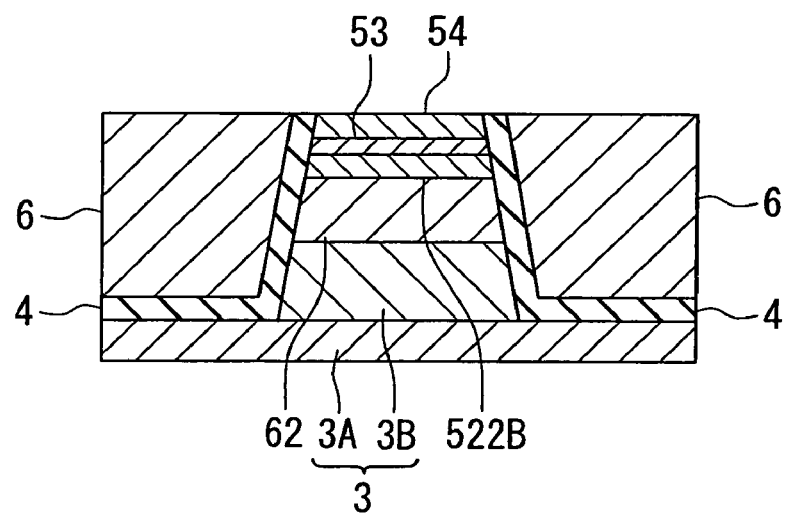
Figure 12C:
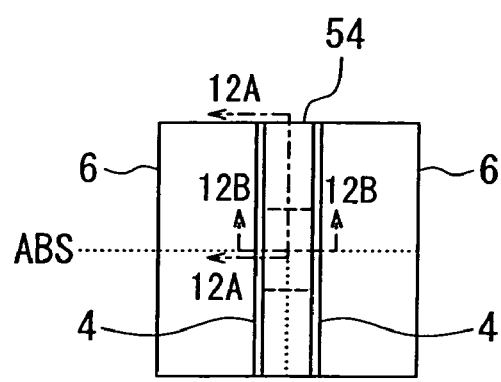

FIG. 12A to FIG. 12C illustrate the next step. FIG. 12A shows a cross section taken along line 12A-12A of FIG. 12C. FIG. 12B shows a cross section taken along line 12B-12B of FIG. 12C. In this step, first, the layered film on the first layer 3A is selectively etched by dry etching through the use of the mask 73. This provides the layered film with two side portions. Next, with the mask 73 left unremoved, the insulating film 4 and the bias magnetic field applying layers 6 are formed by sputtering, for example. Next, the mask 73 is lifted off.

Figure 13A:
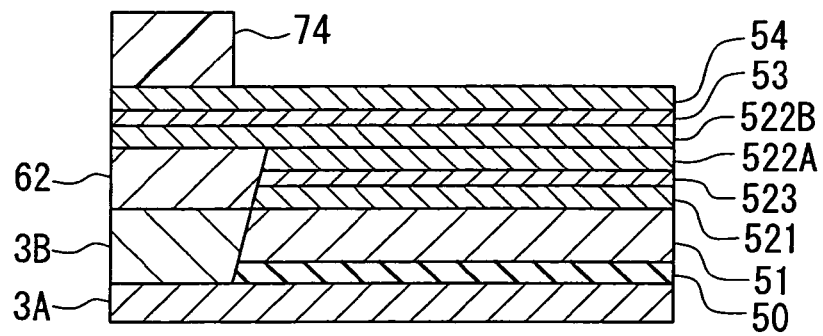
FIG. 13A to FIG. 13C are explanatory views illustrating a step that follows the step of FIG. 12A to FIG. 12C.
Figure 13B:
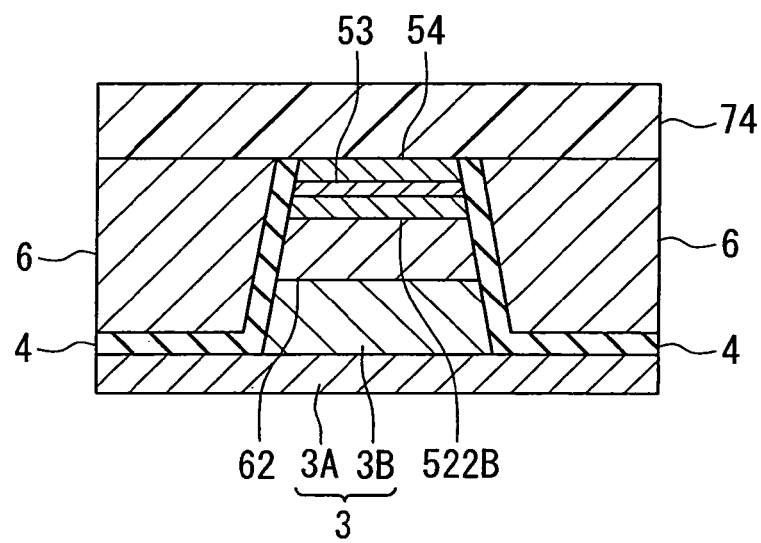
Figure 13C:
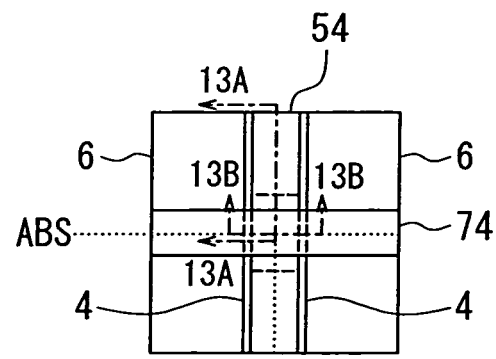

FIG. 13A to FIG. 13C illustrate the next step. FIG. 13A shows a cross section taken along line 13A-13A of FIG. 13C. FIG. 13B shows a cross section taken along line 13B-13B of FIG. 13C. In this step, a mask 74 for forming the end face of the second ferromagnetic layer 54 farther from the detection surface 5a is formed on the stack of layers shown in FIG. 12A to FIG. 12C. The mask 74 is formed by patterning a photoresist layer through photolithography, for example.

Figure 14A:
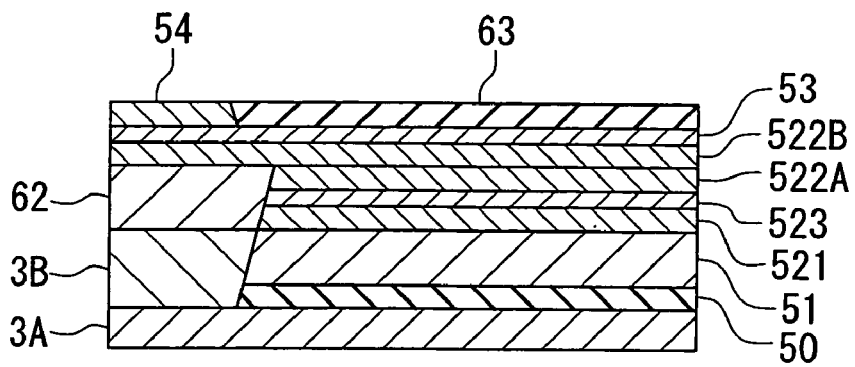
FIG. 14A to FIG. 14C are explanatory views illustrating a step that follows the step of FIG. 13A to FIG. 13C.
Figure 14B:
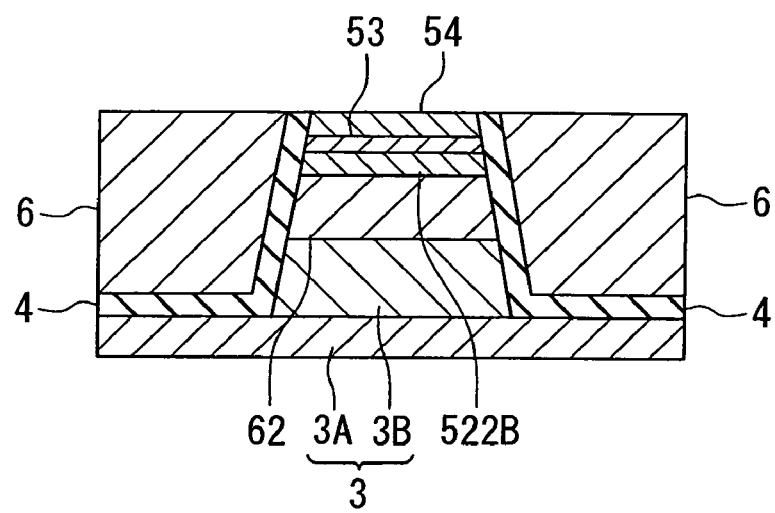
Figure 14C:
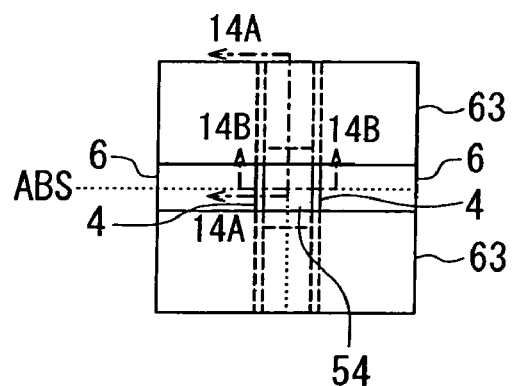

FIG. 14A to FIG. 14C illustrate the next step. FIG. 14A shows a cross section taken along line 14A-14A of FIG. 14C. FIG. 14B shows a cross section taken along line 14B-14B of FIG. 14C. In this step, first, the second ferromagnetic layer 54 is selectively etched by dry etching through the use of the mask 74. This provides the second ferromagnetic layer 54 with the end face farther from the detection surface 5a. Next, with the mask 74 left unremoved, the insulating layer 63 is formed by sputtering, for example. Next, the mask 74 is lifted off.

Figure 15A:
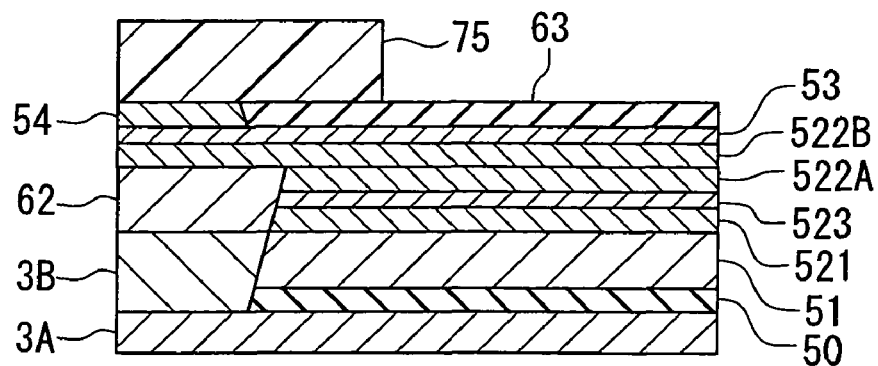
FIG. 15A to FIG. 15C are explanatory views illustrating a step that follows the step of FIG. 14A to FIG. 14C.
Figure 15B:
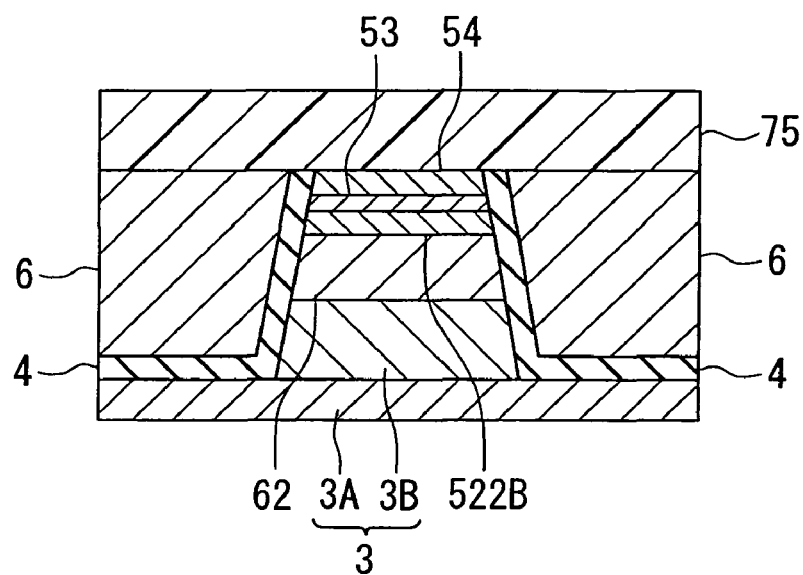
Figure 15C:
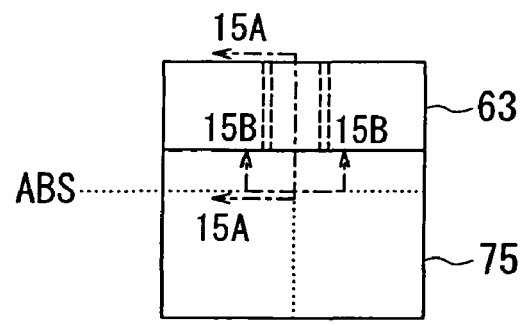

FIG. 15A to FIG. 15C illustrate the next step. FIG. 15A shows a cross section taken along line 15A-15A of FIG. 15C. FIG. 15B shows a cross section taken along line 15B-15B of FIG. 15C. In this step, a mask 75 for forming the insulating layer 64 is formed on the stack of layers shown in FIG. 14A to FIG. 14C. The mask 75 has an opening formed in a region in which the insulating layer 64 is to be disposed. The mask 75 is formed by patterning a photoresist layer through photolithography, for example.

Figure 16A:
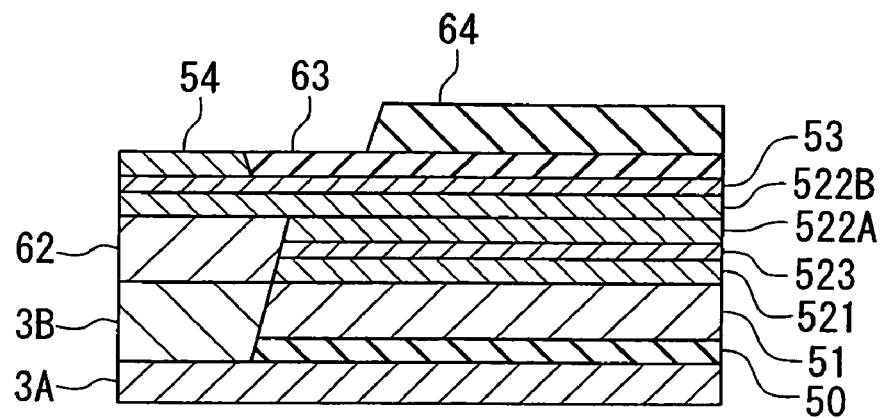
FIG. 16A to FIG. 16C are explanatory views illustrating a step that follows the step of FIG. 15A to FIG. 15C.
Figure 16B:
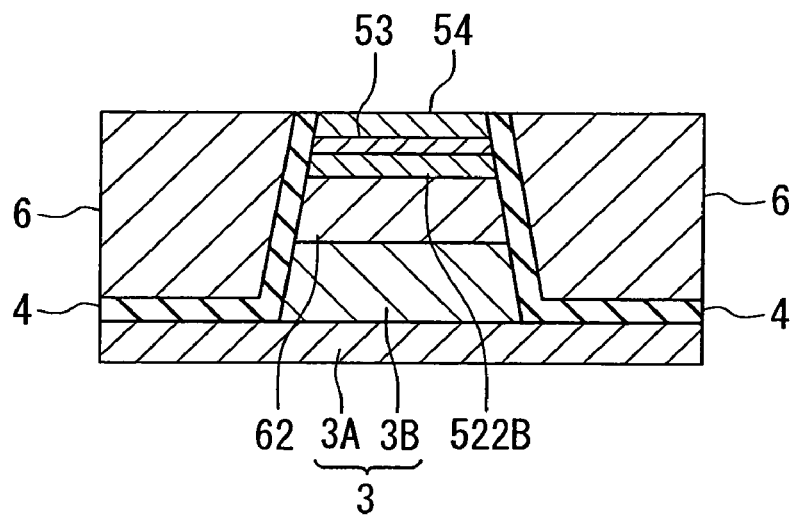
Figure 16C:
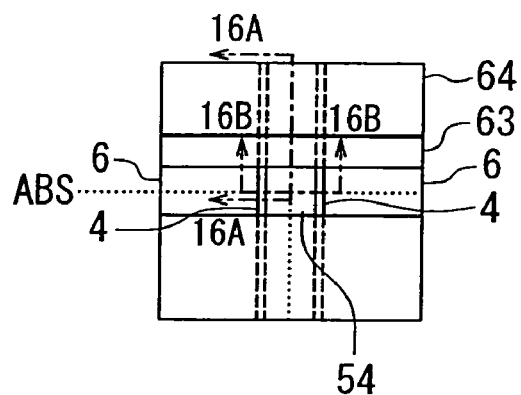

FIG. 16A to FIG. 16C illustrate the next step. FIG. 16A shows a cross section taken along line 16A-16A of FIG. 16C. FIG. 16B shows a cross section taken along line 16B-16B of FIG. 16C. In this step, first, the insulating layer 64 is formed on the stack of layers shown in FIG. 15A to FIG. 15C by sputtering, for example. Next, the mask 75 is lifted off.

Figure 17A:
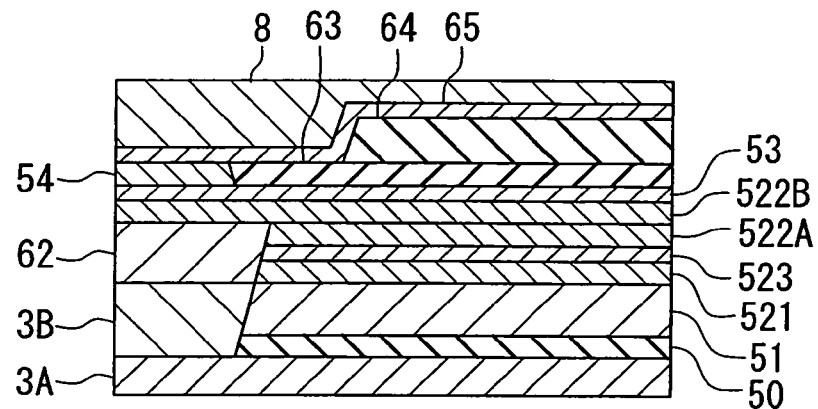
FIG. 17A to FIG. 17C are explanatory views illustrating a step that follows the step of FIG. 16A to FIG. 16C.
Figure 17B:
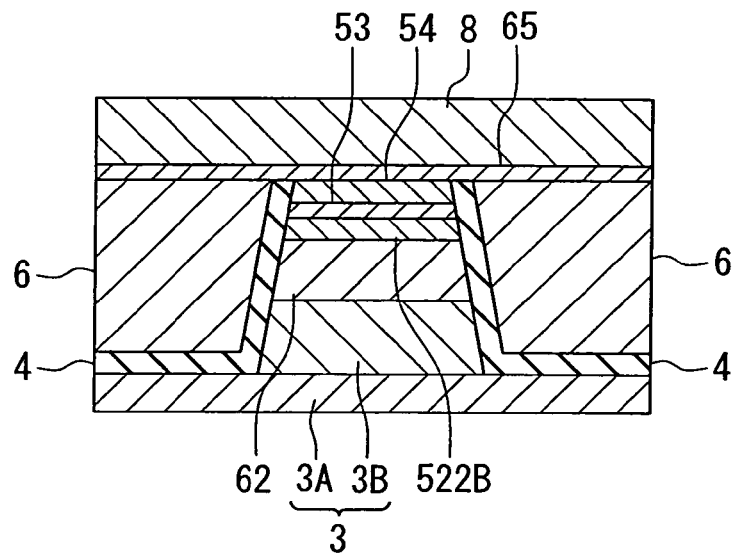
Figure 17C:
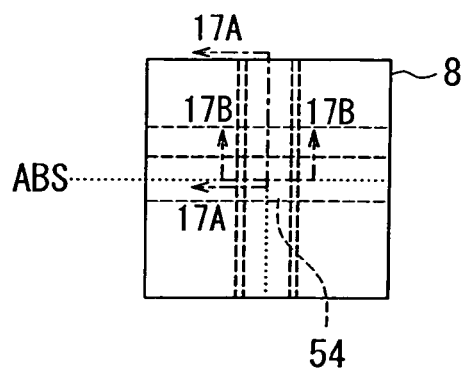

FIG. 17A to FIG. 17C illustrate the next step. FIG. 17A shows a cross section taken along line 17A-17A of FIG. 17C. FIG. 17B shows a cross section taken along line 17B-17B of FIG. 17C. In this step, first, the nonmagnetic conductive layer 65 is formed on the stack of layers shown in FIG. 16A to FIG. 16C by sputtering, for example. Next, the second read shield 8 is formed on the nonmagnetic conductive layer 65 by frame plating, for example.

The stack of layers shown in FIG. 17A to FIG. 17C will be polished later from the bottom shown in FIG. 17C to a level indicated with "ABS" when polishing for forming the medium facing surface 40 is performed. As a result, the medium facing surface 40 and the detection surface 5a are formed and the read head is thereby completed.

Figure 18:
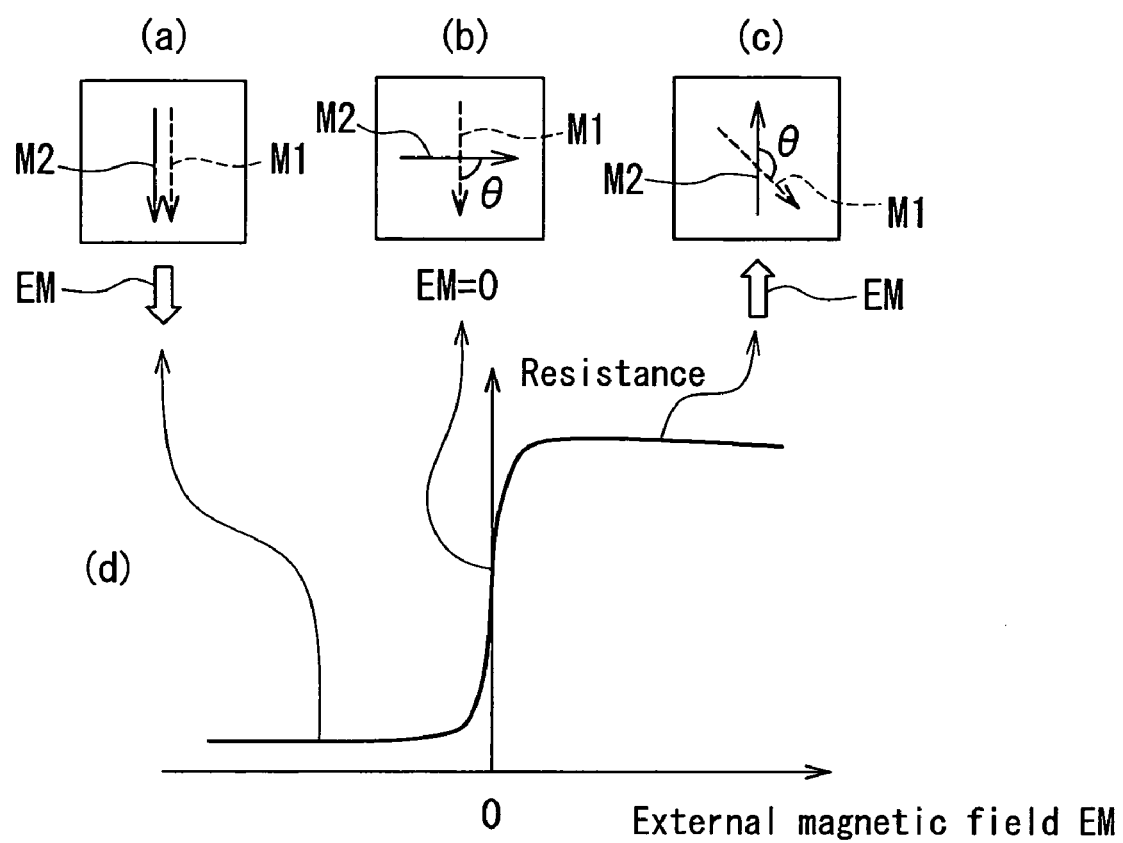
FIG. 18 is an explanatory view for explaining the operation of the MR element of the first embodiment of the invention.

The operation of the MR element 5 of the embodiment will now be described with reference to FIG. 18. In FIG. 18 the portions (a) to (c) each illustrate the relationship between the direction of the magnetization of the first portion 52A of the first ferromagnetic layer 52 and the direction of the magnetization of the second ferromagnetic layer 54. In each of the portions (a) to (c) of FIG. 18 the arrow marked with "EM" indicates an external magnetic field, the arrow marked with "M1" indicates the direction of the magnetization of the first portion 52A, and the arrow marked with "M2" indicates the direction of the magnetization of the second ferromagnetic layer 54. The relative angle between the directions of the magnetizations of the first portion 52A and the second ferromagnetic layer 54 is represented by $\theta$. Here, with regard to the external magnetic field EM, the magnetic field in the upward direction in FIG. 18 is defined as a magnetic field of a positive value, while the magnetic field in the downward direction in FIG. 18 is defined as a magnetic field of a negative value.

The portion (b) of FIG. 18 illustrates a state in which any external magnetic field EM is not applied to the MR element 5. In this state, the direction M1 of the magnetization of the first portion 52A is perpendicular or nearly perpendicular to the detection surface 5a due to the effect of the magnetization of the second portion 52B. On the other hand, the direction M2 of the magnetization of the second ferromagnetic layer 54 is in the direction of the bias magnetic field generated by the bias magnetic field applying layers 6, that is, the direction of track width. Consequently, the relative angle $\theta$ is 90 degrees or nearly 90 degrees.

The portion (a) of FIG. 18 illustrates a state in which an external magnetic field EM of a negative value is applied to the MR element 5. In this state, as in the state illustrated in the portion (b), the direction M1 of the magnetization of the first portion 52A is perpendicular or nearly perpendicular to the detection surface 5a. When the external magnetic field EM of a negative value is applied to the MR element 5, on the other hand, the direction M2 of the magnetization of the second ferromagnetic layer 54 gets closer to the direction of the external magnetic field EM, compared with the state illustrated in the portion (b). As a result, the relative angle $\theta$ becomes smaller than 90 degrees. The portion (a) illustrates a state in which the relative angle $\theta$ is zero degree.

The portion (c) of FIG. 18 illustrates a state in which an external magnetic field EM of a positive value is applied to the MR element 5. When the external magnetic field EM of a positive value is applied, the direction M1 of the magnetization of the first portion 52A is inclined with respect to the direction perpendicular to the detection surface 5a in such a manner as to get closer to the direction of the bias magnetic field, due to the effect of the external magnetic field EM. When the external magnetic field EM of a positive value is applied, on the other hand, the direction M2 of the magnetization of the second ferromagnetic layer 54 gets closer to the direction of the external magnetic field EM, compared with the state illustrated in the portion (b). It should be noted that the change in the direction M2 of the magnetization of the second ferromagnetic layer 54 relative to the state illustrated in the portion (b) is greater than the change in the direction M1 of the magnetization of the first portion 52A relative to the state illustrated in the portion (b). As a result, the relative angle $\theta$ becomes greater than 90 degrees.

The portion (d) of FIG. 18 illustrates the relationship between the external magnetic field EM and the resistance of the MR element 5. As illustrated in the portion (d), the resistance of the MR element 5 changes in response to the external magnetic field EM. It is therefore possible to detect the external magnetic field EM by detecting the resistance of the MR element 5.

As has been described, according to the present embodiment, in the MR element 5 the antiferromagnetic layer 51, which is exchange-coupled to the first ferromagnetic layer 52, is disposed away from the detection surface 5a (the medium facing surface 40). Consequently, according to the embodiment, it is possible to reduce the distance between the two read shields 3 and 8 taken in the medium facing surface 40, that is, the read gap length, compared with a case where an end face of the antiferromagnetic layer is exposed at the detection surface 5a (the medium facing surface 40).

Furthermore, in the present embodiment, the first ferromagnetic layer 52 includes: the first portion 52A having the end face located in the detection surface 5a and the rear end 52Ab opposite to the end face; and the second portion 52B located away from the detection surface 5a and connected to the rear end 52Ab of the first portion 52A. The first portion 52A has the first surface 52A1 touching the spacer layer 53, and the second surface 52A2 that is opposite to the first surface and that does not touch the antiferromagnetic layer 51. The second portion 52B has the third surface 52B3 touching the antiferromagnetic layer 51, and the fourth surface 52B4 opposite to the third surface. The distance T1 between the first surface 52A1 and the second surface 52A2 is smaller than the distance T2 between the third surface 52B3 and the imaginary plane including the first surface 52A1. Specifically, in the present embodiment, the thickness of the portion of the first ferromagnetic layer 52 exposed at the detection surface 5a, that is, the above-mentioned distance T1, is smaller than the distance between the spacer layer 53 and the antiferromagnetic layer 51 taken in the direction in which the layers of the MR element 5 are stacked, that is, the above-mentioned distance T2. Consequently, according to the embodiment, it is possible to reduce the distance between the two read shields 3 and 8 taken in the medium facing surface 40, that is, the read gap length, compared with a case where an end face of a first ferromagnetic layer having a uniform thickness is exposed at the detection surface 5a (the medium facing surface 40).

Furthermore, in the present embodiment, the antiferromagnetic layer 51 has the front end face 51a closer to the medium facing surface 40, and the first read shield 3 includes a portion located between the medium facing surface 40 and the front end face 51a of the antiferromagnetic layer 51. As a result, it is possible to further reduce the distance between the two read shields 3 and 8, that is, the read gap length.

Furthermore, in the present embodiment, the insulating layer 50 is provided between the antiferromagnetic layer 51 and the first layer 3A of the first read shield 3. Consequently, it is possible to prevent a sense current from flowing through the antiferromagnetic layer 51, and as a result, it is possible to feed a greater amount of sense current to a portion of the MR element 5 that exhibits a magnetoresistive effect.

Figure 19:
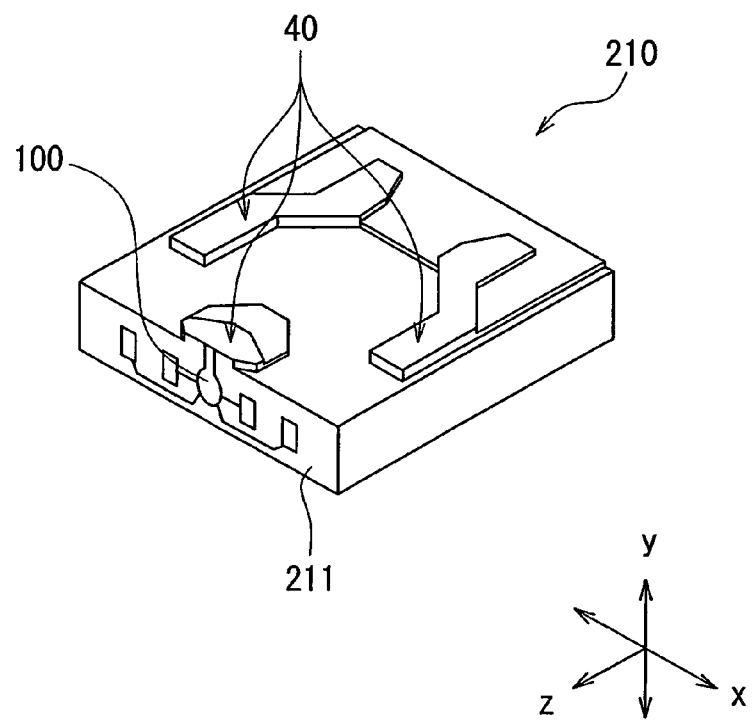
FIG. 19 is a perspective view of a slider including the thin-film magnetic head of the first embodiment of the invention.

A head assembly and a magnetic disk drive of the present embodiment will now be described. Reference is first made to FIG. 19 to describe a slider 210 incorporated in the head assembly. In the magnetic disk drive, the slider 210 is placed to face toward a magnetic disk platter that is a circular-plate-shaped recording medium to be driven to rotate. The slider 210 has a base body 211 made up mainly of the substrate 1 and the overcoat layer 35 of FIG. 4. The base body 211 is nearly hexahedron-shaped. One of the six surfaces of the base body 211 faces toward the magnetic disk platter. The medium facing surface 40 is formed in this one of the surfaces. When the magnetic disk platter rotates in the z direction of FIG. 19, an airflow passes between the magnetic disk platter and the slider 210, and a lift is thereby generated below the slider 210 in the y direction of FIG. 19 and exerted on the slider 210. The slider 210 flies over the surface of the magnetic disk platter by means of the lift. The x direction of FIG. 19 is across the tracks of the magnetic disk platter. The thin-film magnetic head 100 of the embodiment is formed near the air-outflow-side end (the end located at the lower left of FIG. 19) of the slider 210.

Figure 20:
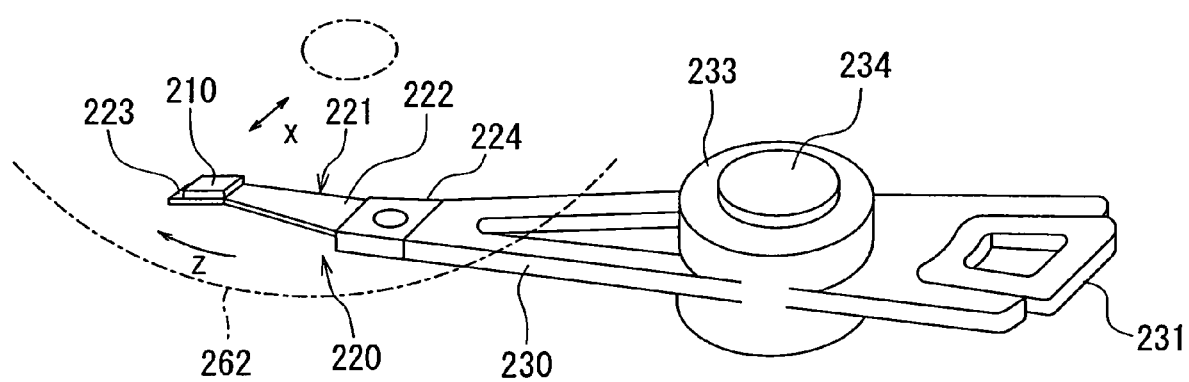
FIG. 20 is a perspective view of a head arm assembly of the first embodiment of the invention.

Reference is now made to FIG. 20 to describe the head assembly of the embodiment. The head assembly of the embodiment has the slider 210 and a supporter that flexibly supports the slider 210. Forms of this head assembly include a head gimbal assembly and a head arm assembly described below.

The head gimbal assembly 220 will be first described. The head gimbal assembly 220 has the slider 210 and a suspension 221 as the supporter that flexibly supports the slider 210. The suspension 221 has: a plate-spring-shaped load beam 222 made of stainless steel, for example; a flexure 223 to which the slider 210 is joined, the flexure 223 being located at an end of the load beam 222 and giving an appropriate degree of freedom to the slider 210; and a base plate 224 located at the other end of the load beam 222. The base plate 224 is attached to an arm 230 of an actuator for moving the slider 210 along the x direction across the tracks of the magnetic disk platter 262. The actuator has the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly including the arm 230 and the head gimbal assembly 220 attached to the arm 230 is called a head arm assembly. An assembly including a carriage having a plurality of arms wherein the head gimbal assembly 220 is attached to each of the arms is called a head stack assembly.

FIG. 20 illustrates the head arm assembly of the embodiment. In the head arm assembly, the head gimbal assembly 220 is attached to an end of the arm 230. A coil 231 that is part of the voice coil motor is fixed to the other end of the arm 230. A bearing 233 is provided in the middle of the arm 230. The bearing 233 is attached to a shaft 234 that rotatably supports the arm 230.

Figure 21:
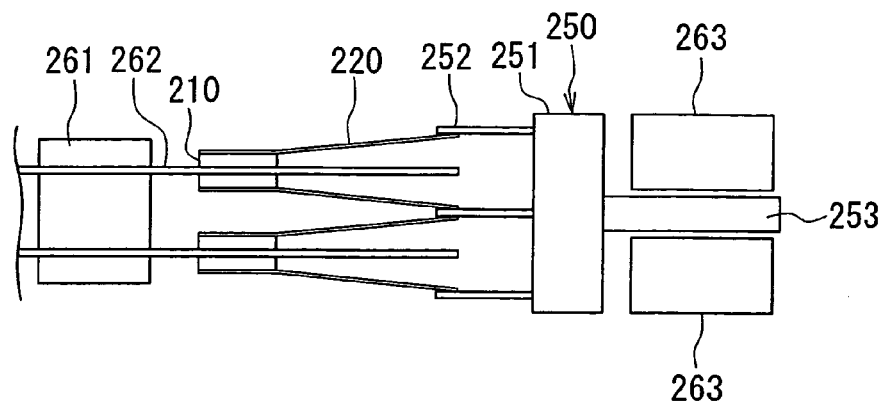
FIG. 21 is an explanatory view for illustrating a main part of a magnetic disk drive of the first embodiment of the invention.
Figure 22:
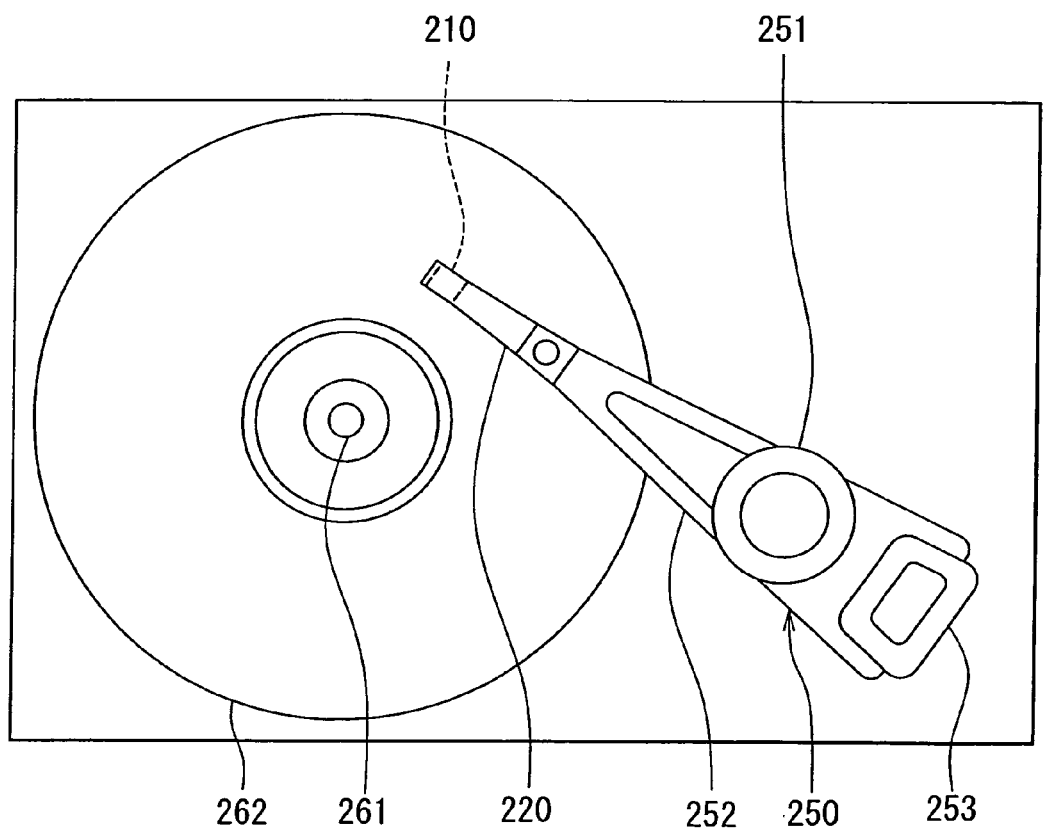
FIG. 22 is a top view of the magnetic disk drive of the first embodiment of the invention.

Reference is now made to FIG. 21 and FIG. 22 to describe an example of the head stack assembly and the magnetic disk drive of the embodiment. FIG. 21 is an explanatory view illustrating the main part of the magnetic disk drive, and FIG. 22 is a top view of the magnetic disk drive. The head stack assembly 250 incorporates a carriage 251 having a plurality of arms 252. A plurality of head gimbal assemblies 220 are attached to the arms 252 such that the assemblies 220 are arranged in the vertical direction with spacing between respective adjacent ones. A coil 253 that is part of the voice coil motor is mounted on the carriage 251 on a side opposite to the arms 252. The head stack assembly 250 is installed in the magnetic disk drive. The magnetic disk drive includes a plurality of magnetic disk platters 262 mounted on a spindle motor 261. Two of the sliders 210 are allocated to each of the platters 262, such that the two sliders 210 are opposed to each other with each of the platters 262 disposed in between. The voice coil motor includes permanent magnets 263 disposed to be opposed to each other, the coil 253 of the head stack assembly 250 being placed between the magnets 263. The actuator and the head stack assembly 250 except the sliders 210 support the sliders 210 and align them with respect to the magnetic disk platters 262.

In the magnetic disk drive of the embodiment, the actuator moves the slider 210 across the tracks of the magnetic disk platter 262 and aligns the slider 210 with respect to the magnetic disk platter 262. The thin-film magnetic head incorporated in the slider 210 writes data on the magnetic disk platter 262 by using the write head, and reads data stored on the magnetic disk platter 262 by using the read head.

The head assembly and the magnetic disk drive of the embodiment exhibit effects similar to those of the foregoing thin-film magnetic head of the embodiment.

Second Embodiment

Figure 23:
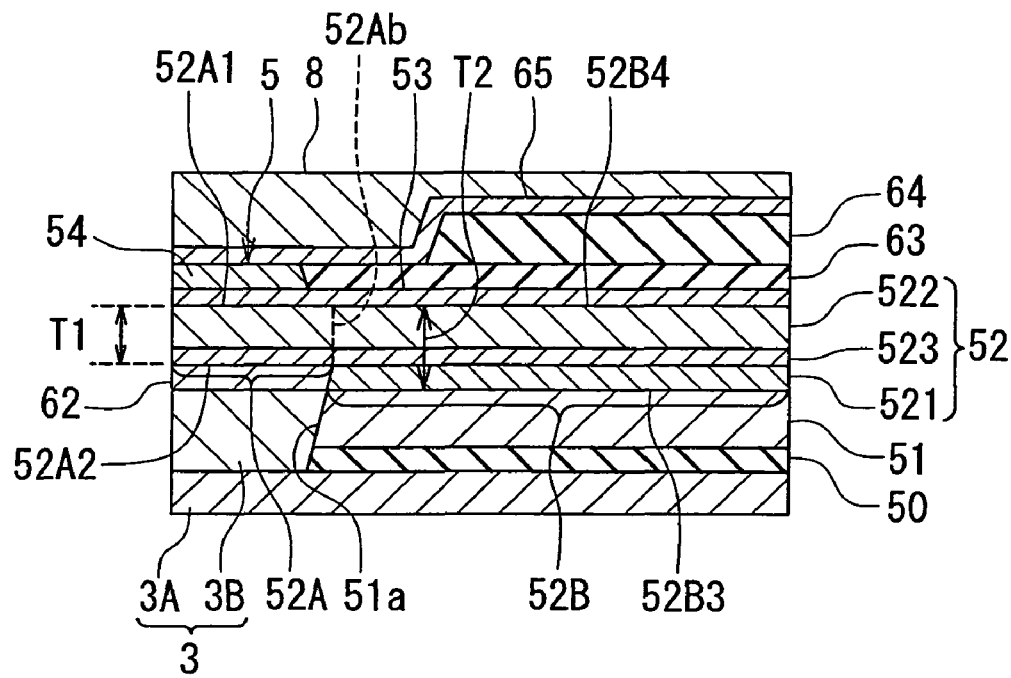
FIG. 23 is a cross-sectional view of a read head including a magnetoresistive element of a second embodiment of the invention.
Figure 24:
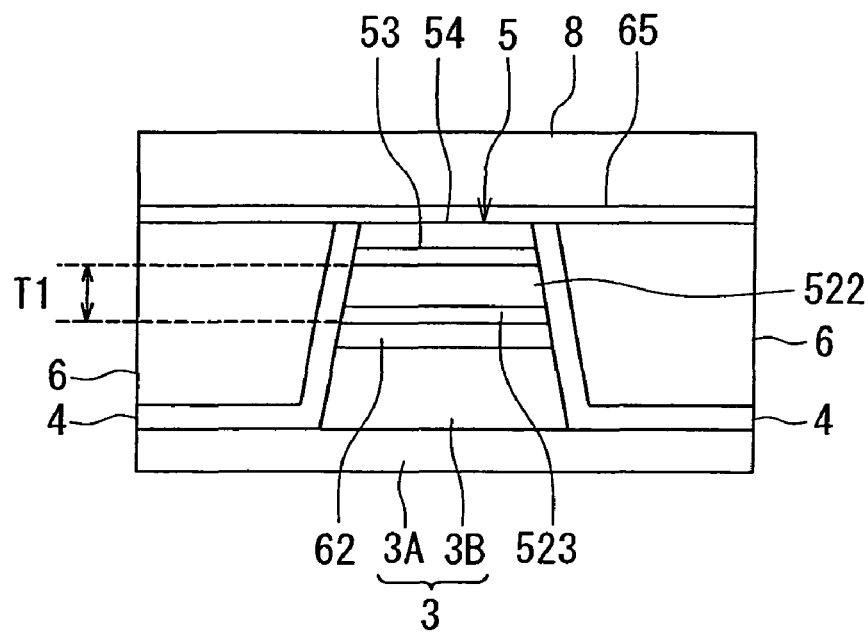
FIG. 24 is a front view of the read head of FIG. 23.

A second embodiment of the invention will now be described. Reference is first made to FIG. 23 and FIG. 24 to describe the configuration of the MR element 5 and the read head of the second embodiment. FIG. 23 is a cross-sectional view of the read head. FIG. 24 is a front view of the read head.

The MR element 5 and the read head of the second embodiment are different from those of the first embodiment in the following respects. First, in the first embodiment the second ferromagnetic material layer 522 of the first ferromagnetic layer 52 has the first layer 522A and the second layer 522B, whereas in the second embodiment the second ferromagnetic material layer 522 is made up of a single layer. This second ferromagnetic material layer 522 is present in the first portion 52A and the second portion 52B. Furthermore, in the second embodiment the nonmagnetic intermediate layer 523 is also present in the first portion 52A and the second portion 52B. The first ferromagnetic material layer 521 is present only in the second portion 52B out of the first and second portions 52A and 52B, as in the first embodiment.

Reference is now made to FIG. 25A to FIG. 28A and FIG. 25B to FIG. 28B to describe a method of fabricating the read head, including the MR element 5, of the second embodiment. FIG. 25A to FIG. 28A each illustrate a cross section of a stack of layers formed in the course of fabricating the read head, the cross section being perpendicular to the medium facing surface and the top surface of the substrate. FIG. 25B to FIG. 28B each illustrate a cross section of the stack of layers taken at a position at which the medium facing surface is to be formed. The substrate 1 and the insulating layer 2 are omitted in FIG. 25A to FIG. 28A and FIG. 25B to FIG. 28B.

Figure 25A:
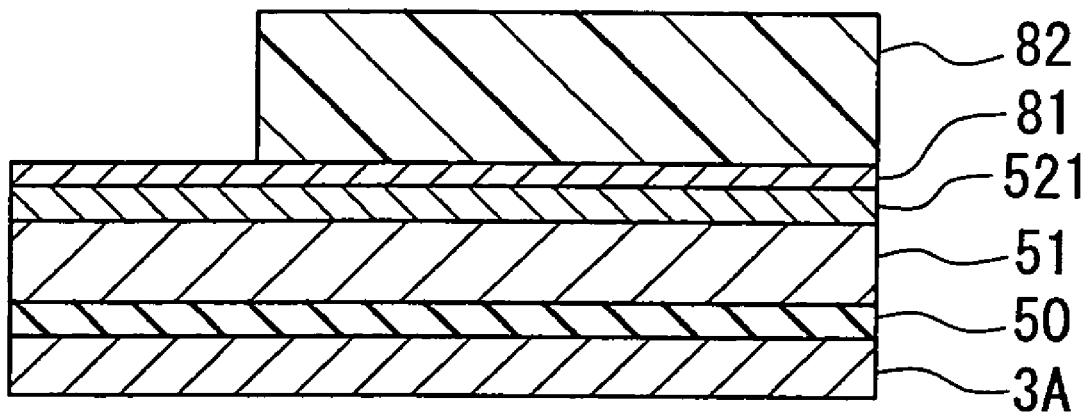
FIG. 25A and FIG. 25B are explanatory views illustrating a step of a method of fabricating the read head including the magnetoresistive element of the second embodiment of the invention.
Figure 25B:
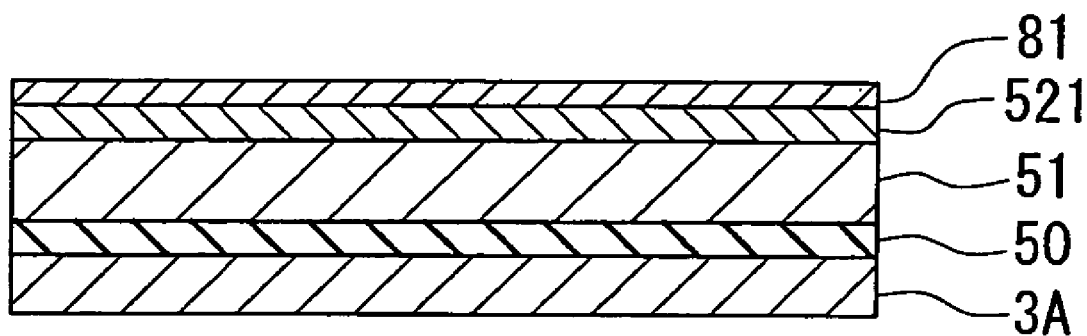

FIG. 25A and FIG. 25B illustrate a step of the method of fabricating the read head. In the method of fabricating the read head of the present embodiment, first, the first layer 3A of the first read shield 3 is formed on the insulating layer 2 by frame plating, for example. Next, the insulating layer 50, the antiferromagnetic layer 51, the first ferromagnetic material layer 521, and a nonmagnetic conductive layer 81 are formed in this order on the first layer 3A by sputtering, for example. The nonmagnetic conductive layer 81 is formed of Ta, for example. Next, a mask 82 is formed on the nonmagnetic conductive layer 81. The mask 82 has an opening formed in a region in which the second layer 3B of the first read shield 3 and the nonmagnetic conductive layer 62 are to be disposed. The mask 82 is formed by patterning a photoresist layer through photolithography, for example.

Figure 26A:
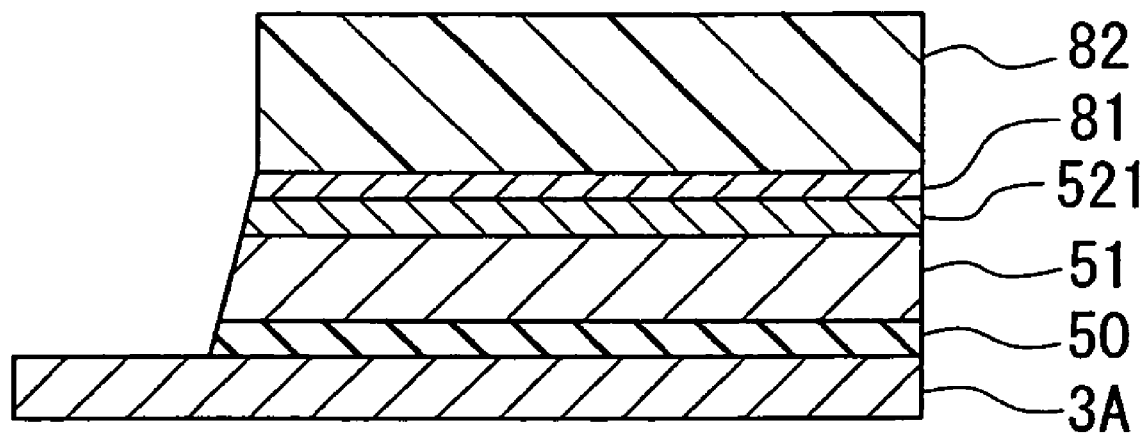
FIG. 26A and FIG. 26B are explanatory views illustrating a step that follows the step of FIG. 25A and FIG. 25B.
Figure 26B:

FIG. 26A and FIG. 26B illustrate the next step. In this step, a portion of a layered film made up of layers from the insulating layer 50 to the nonmagnetic conductive layer 81, the portion corresponding to the opening of the mask 82, is selectively etched by dry etching. As a result, a groove is formed in the above-mentioned layered film in the region in which the second layer 3B and the nonmagnetic conductive layer 62 are to be disposed.

Figure 27A:
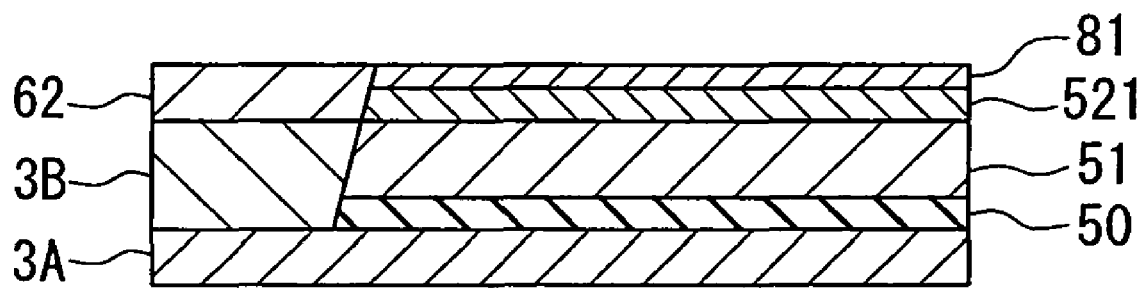
FIG. 27A and FIG. 27B are explanatory views illustrating a step that follows the step of FIG. 26A and FIG. 26B.
Figure 27B:
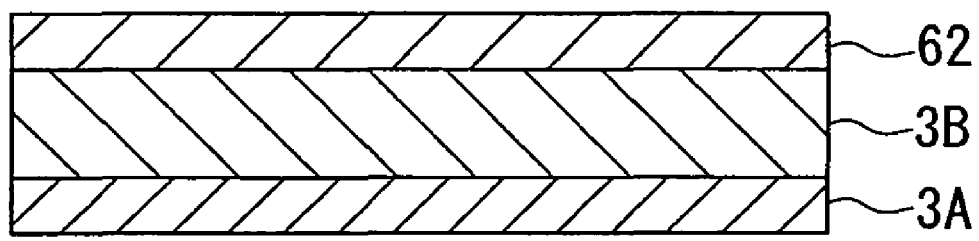

FIG. 27A and FIG. 27B illustrate the next step. In this step, first, with the mask 82 left unremoved, the second layer 3B and the nonmagnetic conductive layer 62 are formed in this order by sputtering, for example, so that the above-mentioned groove is filled with these layers. Next, the mask 82 is lifted off.

Figure 28A:
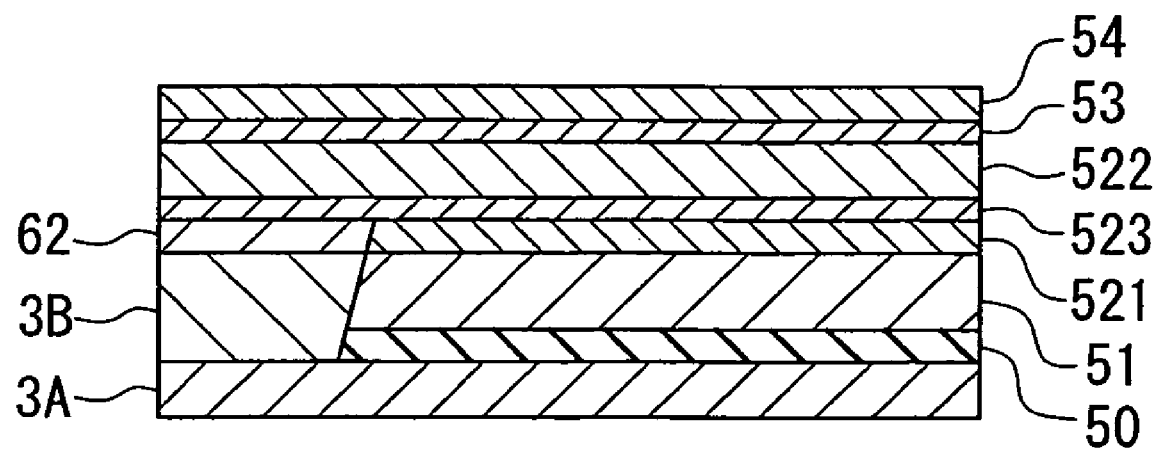
FIG. 28A and FIG. 28B are explanatory views illustrating a step that follows the step of FIG. 27A and FIG. 27B.
Figure 28B:
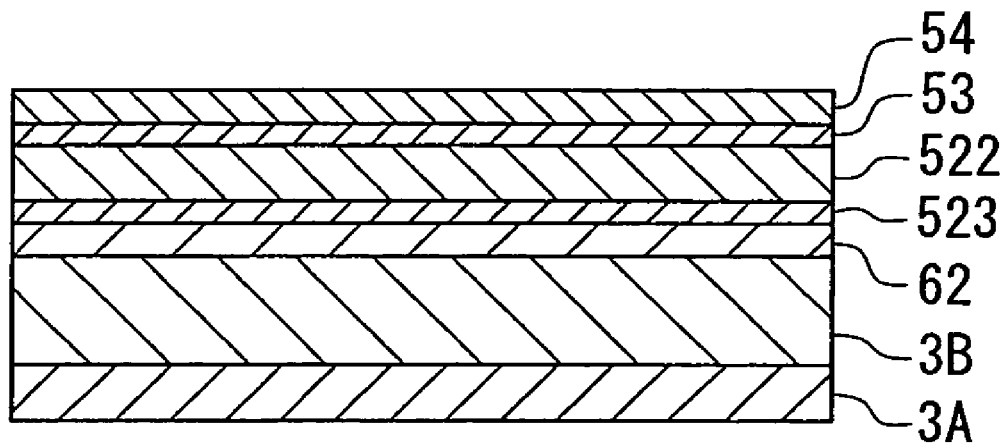

FIG. 28A and FIG. 28B illustrate the next step. In this step, first, the top surface of the stack of layers shown in FIG. 27A and FIG. 27B is polished by CMP, for example, until the first ferromagnetic material layer 521 is exposed. Next, the nonmagnetic intermediate layer 523, the second ferromagnetic material layer 522, the spacer layer 53 and the second ferromagnetic layer 54 are formed in this order by sputtering, for example, on the stack of layers having undergone the polishing.

In the method of fabricating the read head of the second embodiment, the steps that follow are the same as the steps described with reference to FIG. 11A to FIG. 17A, FIG. 11B to FIG. 17B, and FIG. 11C to FIG. 17C in the first embodiment.

The remainder of configuration, function and effects of the second embodiment are similar to those of the first embodiment.

The present invention is not limited to the foregoing embodiments but can be carried out in various modifications. For example, the read shields 3 and 8 and the layers constituting the MR element 5 may be disposed such that the upper-lower relationship is the reverse of that of the foregoing embodiments.

In addition, while the embodiments have been described with reference to a thin-film magnetic head having a structure in which the read head is formed on the base body and the write head is stacked on the read head, the read head and the write head may be stacked in the reverse order. In addition, when the thin-film magnetic head is to be used only for read operations, the thin-film magnetic head may be configured to include the read head only.

The present invention is applicable not only to MR elements used as read heads of thin-film magnetic heads, but also to MR elements used for various purposes in general.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A magnetoresistive element to be disposed between a pair of shields, comprising:
   a detection surface that receives a magnetic field to be detected;
   a first ferromagnetic layer;
   a second ferromagnetic layer whose magnetization changes its direction in response to an external magnetic field;
   a spacer layer made of a nonmagnetic material and disposed between the first and second ferromagnetic layers; and
   an antiferromagnetic layer disposed on a side of the first ferromagnetic layer farther from the spacer layer and exchange-coupled to the first ferromagnetic layer, wherein:
   the first ferromagnetic layer, the second ferromagnetic layer and the spacer layer extend in a direction intersecting the detection surface;
   each of the second ferromagnetic layer and the spacer layer has an end face located in the detection surface;

the antiferromagnetic layer is disposed away from the detection surface;

the first ferromagnetic layer includes: a first portion having an end face located in the detection surface and a rear end opposite to the end face; and a second portion located away from the detection surface and connected to the rear end of the first portion;

the first portion has a first surface touching the spacer layer, and a second surface that is opposite to the first surface and that does not touch the antiferromagnetic layer;

the second portion has a third surface touching the antiferromagnetic layer, and a fourth surface opposite to the third surface; and a distance extending normally from the first surface to the second surface is smaller than a distance extending normally from the third surface to a plane corresponding to an imaginary extension of the first surface.

2. The magnetoresistive element according to claim 1, wherein:

the first ferromagnetic layer includes: a first ferromagnetic material layer made of a ferromagnetic material and touching the antiferromagnetic layer; a second ferromagnetic material layer made of a ferromagnetic material and touching the spacer layer; and a nonmagnetic intermediate layer that is made of a nonmagnetic conductive material and inserted between the first and second ferromagnetic material layers and that antiferromagnetically couples the first and second ferromagnetic material layers to each other;

the second ferromagnetic material layer is present in the first portion and the second portion; and the first ferromagnetic material layer is present only in the second portion out of the first and second portions.

3. The magnetoresistive element according to claim 2, wherein the nonmagnetic intermediate layer is present only in the second portion out of the first and second portions.

4. The magnetoresistive element according to claim 2, wherein the nonmagnetic intermediate layer is present in the first portion and the second portion.

5. The magnetoresistive element according to claim 1, wherein the antiferromagnetic layer has a fifth surface touching the third surface of the second portion, and a sixth surface opposite to the fifth surface, the magnetoresistive element further comprising an insulating layer touching the sixth surface.

6. A thin-film magnetic head comprising: a medium facing surface that faces toward a recording medium; a first shield and a second shield each extending in a direction intersecting the medium facing surface; and a magnetoresistive element disposed between the first and second shields near the medium facing surface to detect a signal magnetic field sent from the recording medium, the magnetoresistive element comprising:

a detection surface that is located in the medium facing surface and receives the signal magnetic field sent from the recording medium;

a first ferromagnetic layer;

a second ferromagnetic layer whose magnetization changes its direction in response to an external magnetic field;

a spacer layer made of a nonmagnetic material and disposed between the first and second ferromagnetic layers; and an antiferromagnetic layer disposed on a side of the first ferromagnetic layer farther from the spacer layer and exchange-coupled to the first ferromagnetic layer, wherein:

the first ferromagnetic layer is located closer to the first shield than is the second ferromagnetic layer;

the first ferromagnetic layer, the second ferromagnetic layer and the spacer layer extend in a direction intersecting the detection surface;

each of the second ferromagnetic layer and the spacer layer has an end face located in the detection surface;

the antiferromagnetic layer is disposed away from the detection surface;

the first ferromagnetic layer includes: a first portion having an end face located in the detection surface and a rear end opposite to the end face; and a second portion located away from the detection surface and connected to the rear end of the first portion;

the first portion has a first surface touching the spacer layer, and a second surface that is opposite to the first surface and that does not touch the antiferromagnetic layer;

the second portion has a third surface touching the antiferromagnetic layer, and a fourth surface opposite to the third surface; and a distance extending normally from the first surface to the second surface is smaller than a distance extending normally from the third surface to a plane corresponding to an imaginary extension of the first surface.

7. The thin-film magnetic head according to claim 6, wherein:

the first ferromagnetic layer includes: a first ferromagnetic material layer made of a ferromagnetic material and touching the antiferromagnetic layer; a second ferromagnetic material layer made of a ferromagnetic material and touching the spacer layer; and a nonmagnetic intermediate layer that is made of a nonmagnetic conductive material and inserted between the first and second ferromagnetic material layers and that antiferromagnetically couples the first and second ferromagnetic material layers to each other;

the second ferromagnetic material layer is present in the first portion and the second portion; and the first ferromagnetic material layer is present only in the second portion out of the first and second portions.

8. The thin-film magnetic head according to claim 7, wherein the nonmagnetic intermediate layer is present only in the second portion out of the first and second portions.

9. The thin-film magnetic head according to claim 7, wherein the nonmagnetic intermediate layer is present in the first portion and the second portion.

10. The thin-film magnetic head according to claim 6, wherein:

the antiferromagnetic layer has a front end face closer to the medium facing surface; and the first shield includes a portion located between the medium facing surface and the front end face of the antiferromagnetic layer.

11. The thin-film magnetic head according to claim 6, wherein the magnetoresistive element further comprises an insulating layer disposed between the antiferromagnetic layer and the first shield.

12. A head assembly comprising: a slider including a thin-film magnetic head and disposed to face toward a recording medium; and a supporter flexibly supporting the slider, the thin-film magnetic head comprising: a medium facing surface that faces toward the recording medium; a first shield and a second shield each extending in a direction intersecting the medium facing surface; and a magnetoresistive element disposed between the first and second shields near the medium facing surface to detect a signal magnetic field sent from the recording medium, the magnetoresistive element comprising:
a detection surface that is located in the medium facing surface and receives the signal magnetic field sent from the recording medium;
a first ferromagnetic layer;
a second ferromagnetic layer whose magnetization changes its direction in response to an external magnetic field;
a spacer layer made of a nonmagnetic material and disposed between the first and second ferromagnetic layers; and
an antiferromagnetic layer disposed on a side of the first ferromagnetic layer farther from the spacer layer and exchange-coupled to the first ferromagnetic layer, wherein:
the first ferromagnetic layer is located closer to the first shield than is the second ferromagnetic layer;
the first ferromagnetic layer, the second ferromagnetic layer and the spacer layer extend in a direction intersecting the detection surface;
each of the second ferromagnetic layer and the spacer layer has an end face located in the detection surface;
the antiferromagnetic layer is disposed away from the detection surface;
the first ferromagnetic layer includes: a first portion having an end face located in the detection surface and a rear end opposite to the end face; and a second portion located away from the detection surface and connected to the rear end of the first portion;
the first portion has a first surface touching the spacer layer, and a second surface that is opposite to the first surface and that does not touch the antiferromagnetic layer;
the second portion has a third surface touching the antiferromagnetic layer, and a fourth surface opposite to the third surface; and
a distance extending normally from the first surface to the second surface is smaller than a distance extending normally from the third surface to a plane corresponding to an imaginary extension of the first surface.

13. A magnetic disk drive comprising: a slider including a thin-film magnetic head and disposed to face toward a recording medium that is driven to rotate; and an alignment device supporting the slider and aligning the slider with respect to the recording medium,
the thin-film magnetic head comprising: a medium facing surface that faces toward the recording medium; a first shield and a second shield each extending in a direction intersecting the medium facing surface; and a magnetoresistive element disposed between the first and second shields near the medium facing surface to detect a signal magnetic field sent from the recording medium,
the magnetoresistive element comprising:
a detection surface that is located in the medium facing surface and receives the signal magnetic field sent from the recording medium;
a first ferromagnetic layer;
a second ferromagnetic layer whose magnetization changes its direction in response to an external magnetic field;
a spacer layer made of a nonmagnetic material and disposed between the first and second ferromagnetic layers; and
an antiferromagnetic layer disposed on a side of the first ferromagnetic layer farther from the spacer layer and exchange-coupled to the first ferromagnetic layer, wherein:
the first ferromagnetic layer is located closer to the first shield than is the second ferromagnetic layer;
the first ferromagnetic layer, the second ferromagnetic layer and the spacer layer extend in a direction intersecting the detection surface;
each of the second ferromagnetic layer and the spacer layer has an end face located in the detection surface;
the antiferromagnetic layer is disposed away from the detection surface;
the first ferromagnetic layer includes: a first portion having an end face located in the detection surface and a rear end opposite to the end face; and a second portion located away from the detection surface and connected to the rear end of the first portion;
the first portion has a first surface touching the spacer layer, and a second surface that is opposite to the first surface and that does not touch the antiferromagnetic layer;
the second portion has a third surface touching the antiferromagnetic layer, and a fourth surface opposite to the third surface; and
a distance extending normally from the first surface to the second surface is smaller than a distance extending normally from the third surface to a plane corresponding to an imaginary extension of the first surface.

* * * * *